(12) United States Patent
Matsuoka

(10) Patent No.: US 10,545,878 B2
(45) Date of Patent: Jan. 28, 2020

(54) SEARCH MEMORY

(71) Applicant: RENESAS ELECTRONICS CORPORATION, Tokyo (JP)

(72) Inventor: Hideto Matsuoka, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/191,049

(22) Filed: Nov. 14, 2018

(65) Prior Publication Data

US 2019/0196979 A1   Jun. 27, 2019

(30) Foreign Application Priority Data

Dec. 27, 2017   (JP) .................................. 2017-251714

(51) Int. Cl.
*G11C 15/04* (2006.01)
*G06F 12/1027* (2016.01)
*G11C 15/00* (2006.01)

(52) U.S. Cl.
CPC .......... *G06F 12/1027* (2013.01); *G11C 15/04* (2013.01); *G06F 2212/1008* (2013.01); *G11C 15/00* (2013.01); *G11C 15/046* (2013.01)

(58) Field of Classification Search
CPC ........ G11C 15/00; G11C 15/046; G11C 5/066

USPC .............................................. 365/49.1–49.11
See application file for complete search history.

(56) References Cited

U.S. PATENT DOCUMENTS

| 6,374,326 | B1 | 4/2002 | Kansal et al. | |
|---|---|---|---|---|
| 7,885,090 | B1* | 2/2011 | Gabai | G11C 15/00 365/200 |
| 9,159,420 | B1 | 10/2015 | Wohlgemuth | |
| 9,419,903 | B2* | 8/2016 | Kim | H04L 47/21 |

* cited by examiner

*Primary Examiner* — Han Yang
(74) *Attorney, Agent, or Firm* — McDermott Will & Emery LLP

(57) ABSTRACT

Provided is a search memory capable of suppressing an increase in the area of a chip and an increase in the amount of current consumption. The search memory includes an input control section, N search units, and N first selectors. The input control section receives N (N: two or more) search data that are parallelly inputted. The N first selectors are respectively disposed in association with the N search units to select two search data from the N search data. The search units each include multiple search blocks and M second selectors. The M second selectors select one of two search data selected by the first selectors. For at least one of the N search units, allocation is performed so that two types out of N types of entry data respectively associated with the N search data are respectively stored in the search blocks.

7 Claims, 20 Drawing Sheets

| SRAM CELL (X CELL) | SRAM CELL (Y CELL) | TCAM CELL DATA |
|---|---|---|
| "1" | "0" | "0" |
| "0" | "1" | "1" |
| "0" | "0" | "*" (don't care) |
| "1" | "1" | NOT USED |

| SELQ | DATA |
|---|---|
| 00 | Key0 |
| 01 | Key1 |
| 10 | Key2 |
| 11 | Key3 |

| SELP | SIGNAL |
|------|--------|
| 0    | X      |
| 1    | Y      |

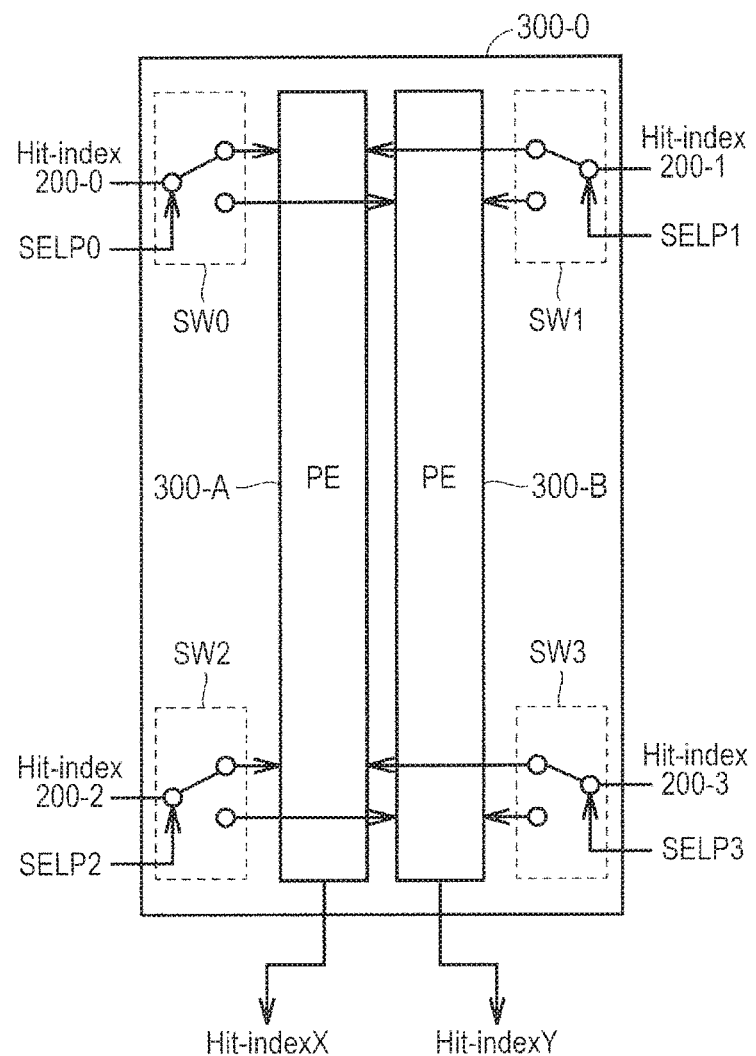

| SELQ | PE |
|---|---|
| 00 | 301A |
| 01 | 301B |
| 10 | 301C |
| 11 | 301D |

| key0 | 4 PS. |
|------|-------|
| key1 | 4 PS. |
| key2 | 4 PS. |
| key3 | 4 PS. |

| 102-0 | key0 (4 PS.) |
|-------|--------------|
| 102-1 | key1 (4 PS.) |
| 102-2 | key2 (4 PS.) |
| 102-3 | key3 (4 PS.) |

| key0 | 6 PS. |
|------|-------|
| key1 | 5 PS. |
| key2 | 3 PS. |
| key3 | 2 PS. |

| 102-0 | key0 (4 PS.) |
|-------|--------------|
| 102-1 | key0 (2 PS.) + key1 (2 PS.) |
| 102-2 | key1 (3 PS.) + key2 (1 PC.) |
| 102-3 | key2 (2 PS.) + key3 (2 PS.) |

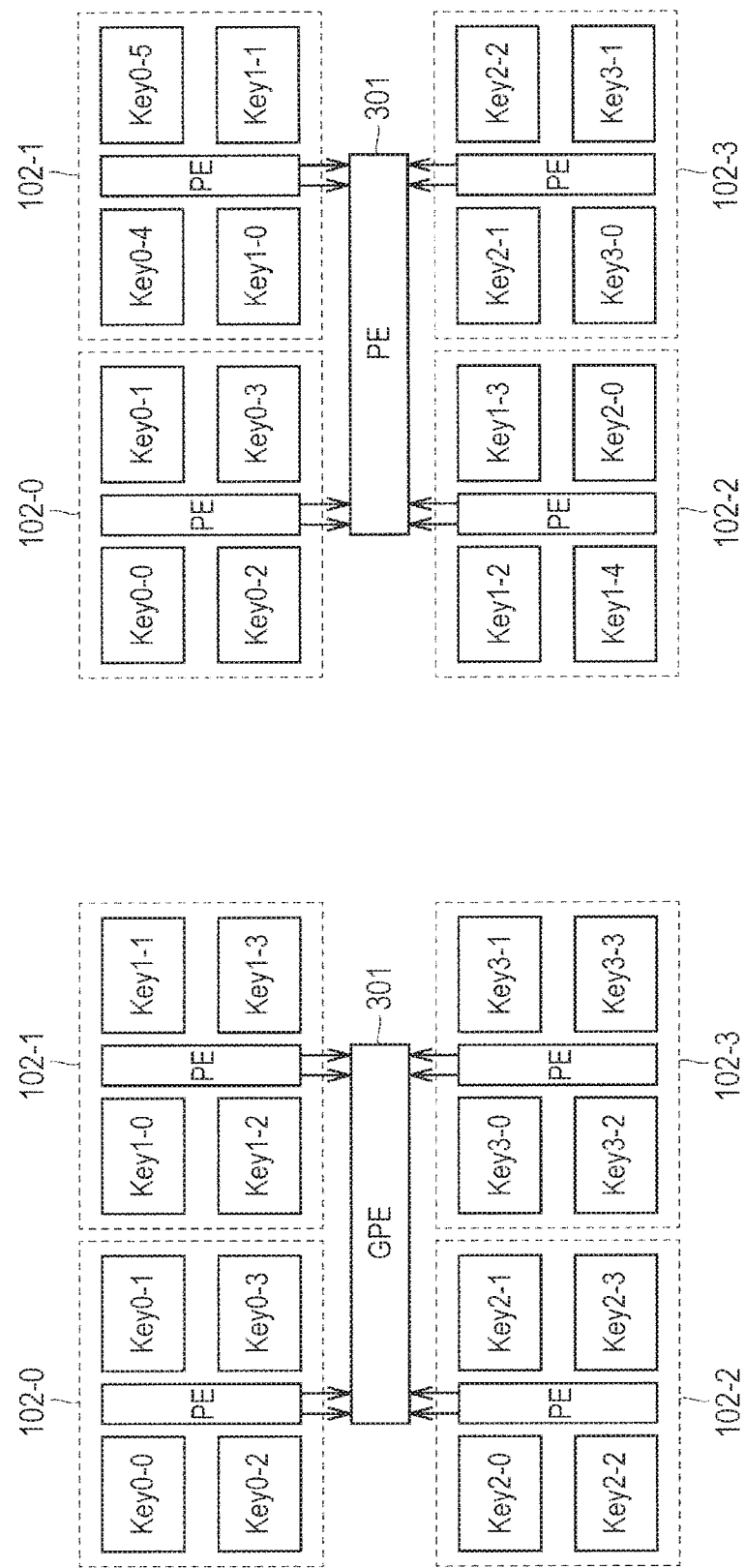

FIG. 13

| SEARCH UNIT | SELECT SIGNAL | | SEARCH BLOCK | SELECT SIGNAL | | Key |
|---|---|---|---|---|---|---|
| 102-0 | SELQ0 | SELQ1 | 201-0 | SELP0 | 0 | Key0 |
| | 00 | 00 | 201-1 | SELP1 | 0 | Key0 |
| | | | 201-2 | SELP2 | 0 | Key0 |
| | | | 201-3 | SELP3 | 0 | Key0 |
| 102-1 | SELQ2 | SELQ3 | 201-4 | SELP4 | 0 | Key0 |
| | 00 | 01 | 201-5 | SELP5 | 0 | Key0 |
| | | | 201-6 | SELP6 | 1 | Key1 |
| | | | 201-7 | SELP7 | 1 | Key1 |
| 102-2 | SELQ4 | SELQ5 | 201-8 | SELP8 | 0 | Key1 |
| | 01 | 10 | 201-9 | SELP9 | 0 | Key1 |
| | | | 201-10 | SELP10 | 0 | Key1 |
| | | | 201-11 | SELP11 | 1 | Key2 |
| 102-3 | SELQ6 | SELQ7 | 201-12 | SELP12 | 0 | Key2 |
| | 10 | 11 | 201-13 | SELP13 | 0 | Key2 |
| | | | 201-14 | SELP14 | 1 | Key3 |
| | | | 201-15 | SELP15 | 1 | Key3 |

| LOGICAL BLOCK ADDRESS | KEY ASSIGNMENT |
|---|---|
| 0000 | Key0-0 |
| 0001 | Key0-1 |
| 0010 | Key0-2 |
| 0011 | Key0-3 |
| 0100 | Key1-0 |
| 0101 | Key1-1 |
| 0110 | Key1-2 |
| 0111 | Key1-3 |
| 1000 | Key2-0 |
| 1001 | Key2-1 |
| 1010 | Key2-2 |
| 1011 | Key2-3 |
| 1100 | Key3-0 |
| 1101 | Key3-1 |
| 1110 | Key3-2 |
| 1111 | Key3-3 |

| LOGICAL BLOCK ADDRESS | PHYSICAL BLOCK ADDRESS |
|---|---|
| 0000 | 0000 |
| 0001 | 0001 |
| 0010 | 0010 |
| 0011 | 0011 |
| 0100 | 0100 |
| 0101 | 0101 |
| 0110 | 0110 |
| 0111 | 0111 |
| 1000 | 1000 |
| 1001 | 1001 |
| 1010 | 1010 |
| 1011 | 1011 |
| 1100 | 1100 |
| 1101 | 1101 |
| 1110 | 1110 |
| 1111 | 1111 |

SEARCH MEMORY

CROSS-REFERENCE TO RELATED APPLICATIONS

The disclosure of Japanese Patent Application No. 2017-251714 filed on Dec. 27, 2017 including the specification, drawings and abstract is incorporated herein by reference in its entirety.

BACKGROUND

The present disclosure relates to a semiconductor device. For example, the present disclosure relates to a search memory.

A memory device called a search memory or a CAM (content addressable memory) searches stored data words for a data word that matches a search word. When a matching data word is found, such a memory device outputs its address.

The CAM comes in two types, namely a BCAM (binary CAM) and a TCAM (ternary CAM). Each memory cell of the BCAM stores "0" or "1" as information. Meanwhile, each memory cell of the TCAM is capable of storing "Don't Care" as information in addition to "0" and "1". In the present example, the symbol "*" is used to represent "Don't Care". The symbol "*" indicates that the information may be either "0" or "1".

TCAM devices are widely used in routers for networks, such as the Internet, in order to perform an address search and provide access control. To provide a large capacity, the TCAM devices usually include multiple arrays and perform a simultaneous search operation on the included arrays.

The TCAM devices are capable of comparing input search data (input packets) and TCAM cell data all at once. Therefore, the TCAM devices are faster in all search applications than RAMs (random-access memories).

More specifically, the TCAM devices include match lines (MLs) for comparing data stored in a memory cell with data that a user wants to search for, and indicating whether or not the data match with each other.

The TCAM devices are configured so as to output address information (hit-index) associated with a matched match line.

In recent years, the number of CAM arrays is increased to enlarge the capacities of CAMs.

Further, proposed are methods of executing search processes in parallel by using multiple search keys (U.S. Pat. Nos. 6,374,326 and 9,159,420).

SUMMARY

Meanwhile, to execute search processes in parallel by using multiple search keys, it is necessary to transmit all the search keys to a CAM array.

Consequently, the width of a data bus may increase to enlarge the area of a chip and the amount of current consumption.

The present disclosure has been made to solve the above problem, and provides a search memory that is capable of suppressing an increase in the area of a chip and an increase in the amount of current consumption.

Other problems and novel features will become apparent from the following description and from the accompanying drawings.

According to an aspect of the present disclosure, there is provided a search memory that performs a search to determine whether inputted search data matches entry data stored in a memory cell array, and outputs address information associated with matching entry data. The search memory includes an input control section, N search units, and N first selectors. The input control section receives the inputs of N (N: two or more) search data that are parallelly inputted. The first selectors are respectively disposed in association with the N search units in order to select two search data from the N search data. Each search unit includes multiple search blocks and M second selectors. The second selectors are respectively disposed in association with the search blocks in order to select one of two search data selected by the first selectors disposed for the associated search units. For at least one of the N search units, allocation is performed so that two types out of N types of entry data respectively associated with the N search data are respectively stored in the search blocks.

The search memory according to an embodiment of the present disclosure is capable of suppressing an increase in the area of a chip and an increase in the amount of current consumption.

BRIEF DESCRIPTION OF THE DRAWINGS

FIGS. 8A and 8B are diagrams illustrating a configuration of a medium priority encoder according to the first embodiment;

FIGS. 11A and 11B are conceptual diagrams illustrating the search blocks that store entry data associated with input search data keys according to the first embodiment;

FIG. 13 is a diagram illustrating select signals allocated to the search units depicted in FIG. 10B;

DETAILED DESCRIPTION

Figure 1:
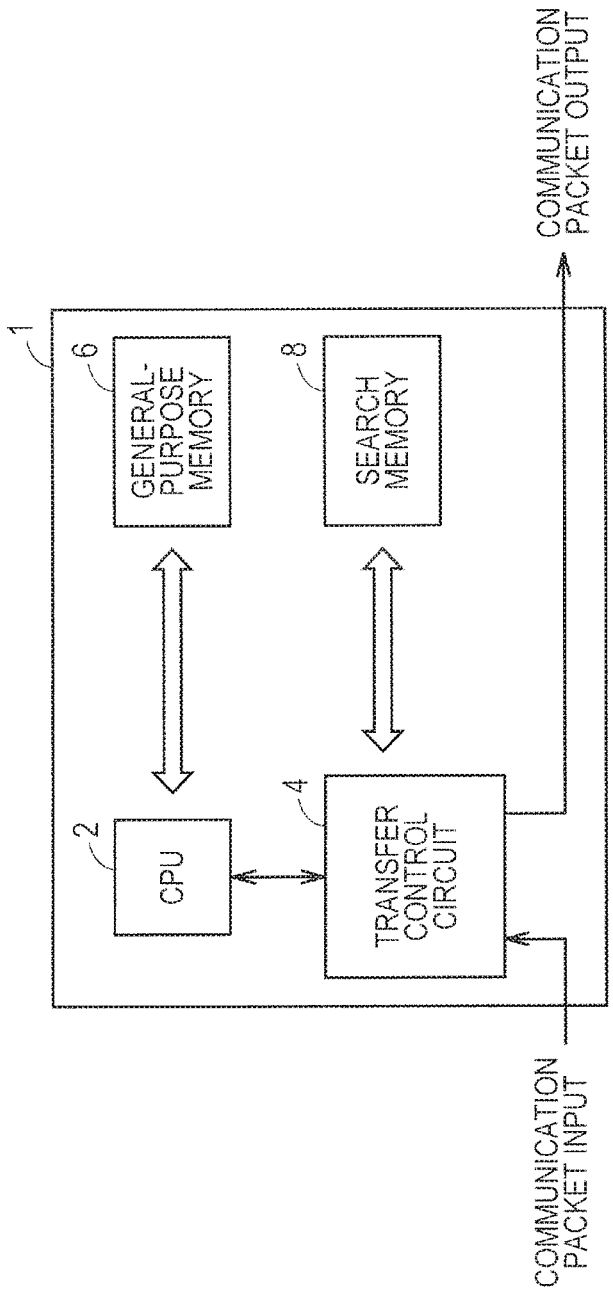
FIG. 1 is a diagram illustrating a configuration of communication equipment 1 according to a first embodiment of the present disclosure.

Embodiments of the present disclosure will now be described in detail with reference to the accompanying drawings. Identical or similar elements in the drawings are designated by the same reference numerals and will not be redundantly described.

First Embodiment

<Overall Configuration of Communication Equipment 1>

FIG. 1 is a diagram illustrating a configuration of communication equipment 1 according to a first embodiment of the present disclosure.

As illustrated in FIG. 1, the communication equipment 1 is a communication device such as a switch or a router.

The communication equipment 1 includes a CPU (central processing unit) 2, a transfer control circuit 4, and a general-purpose memory 6, and a search memory 8.

The CPU 2 provides overall control of the communication equipment 1.

The CPU 2 implements various functions in collaboration with a program stored in the general-purpose memory 6. For example, the general-purpose memory 6 may be formed of a DRAM (dynamic random access memory), and builds an operating system (OS) in collaboration with the CPU 2. The CPU 2 exchanges information, for example, with neighboring communication equipment and exercises maintenance of information necessary for transfer processing.

The transfer control circuit 4 executes a communication packet transfer process. The transfer control circuit 4 includes dedicated hardware specialized for transfer processing, such as an ASIC (application specific integrated circuit) or an NPU (network processing unit). The transfer control circuit 4 accesses the search memory 8 to acquire information necessary for transfer processing.

In the present example, the search memory 8 will be described in relation to a case where a TCAM device is used.

[Configuration of TCAM Cell]

Figures 2, 3:
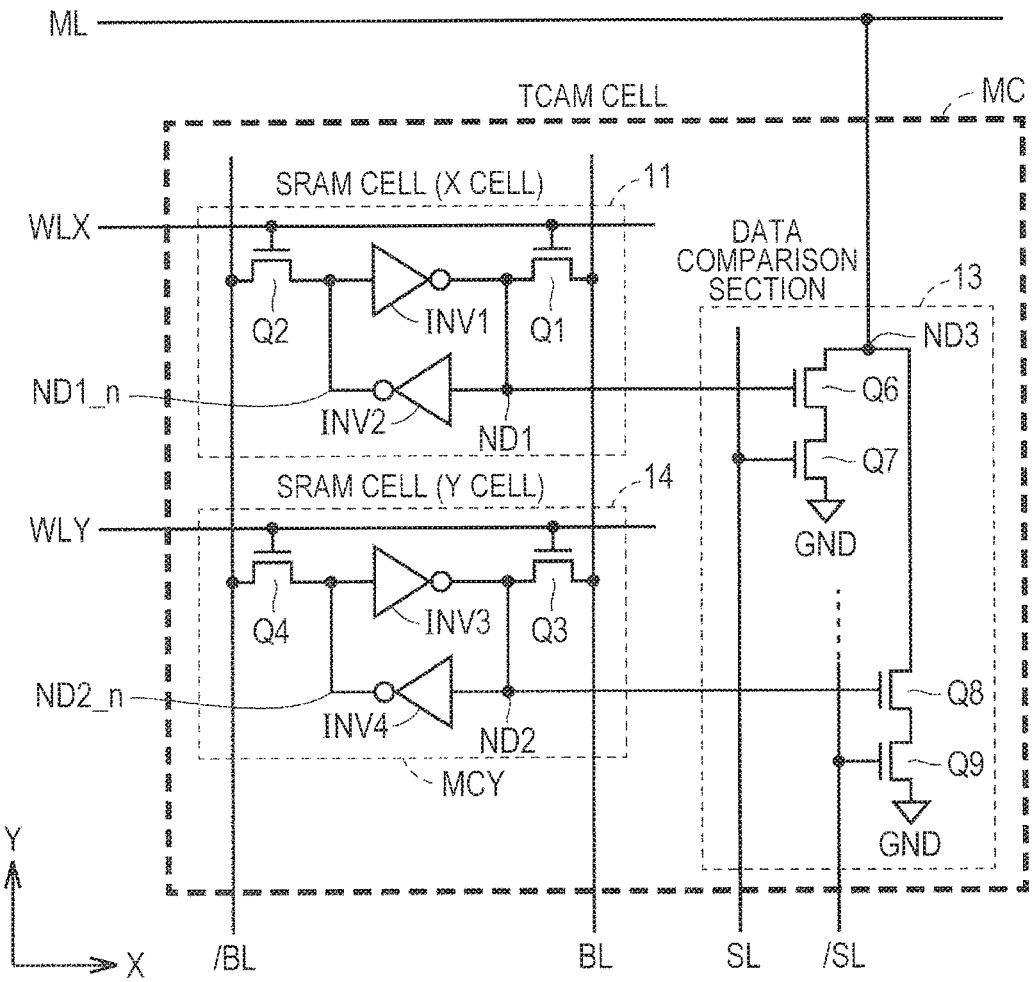
FIG. 2 is a circuit diagram illustrating an exemplary configuration of a TCAM cell.
FIG. 3 is a diagram illustrating, in tabular form, the association between TCAM data and contents stored in an X cell and in a Y cell.

FIG. 2 is a circuit diagram illustrating an exemplary configuration of a TCAM cell.

Referring to FIG. 2, the TCAM cell (referred to also as the memory cell MC) includes two SRAM cells (static random access memory cells) 11, 14 and a data comparison section 13. The SRAM cell 11 is referred to also as the X cells, and the SRAM cell 14 is referred to also as the Y cell. The X cell 11 stores 1-bit data that is mutually complementary to a pair of internal storage nodes ND1, ND1_$n$(if one is "1", the other is "0"). The Y cell 14 stores 1-bit data that is mutually complementary to a pair of internal storage nodes ND2, ND2_$n$. The TCAM cell is referred to also as the search memory cell.

The TCAM cell is coupled to a pair of bit lines BL, /BL, a pair of search lines SL, /SL, a match line ML, and word lines WLX, WLY. The pair of bit lines BL, /BL is extended in the column direction (Y direction) of a TCAM cell array 20 depicted in FIG. 4 and shared by multiple TCAM cells arrayed in the column direction. The pair of search lines SL, /SL is extended in the column direction (Y direction) of the TCAM cell array 20 and shard by the TCAM cells arrayed in the column direction.

The match line ML is extended in the row direction (X direction) of the TCAM cell array 20 and shared by the TCAM cells arrayed in the row direction. The word lines WLX, WLY are extended in the row direction (X direction) of the TCAM cell array 20 and shared by the TCAM cells arrayed in the row direction.

The X cell 11 includes inverters INV1, INV2 and N-channel MOS (metal oxide semiconductor) transistors Q1, Q2. The inverter INV1 is coupled between the storage node ND1 and the storage node ND1_$n$ so that the direction from the storage node ND1_$n$ to the storage node ND1 is a forward direction. The inverter INV2 is coupled in parallel with the inverter INV1 and oriented in an opposite direction to the inverter INV1. The MOS transistor Q1 is coupled between the storage node ND1 and the bit line BL. The MOS transistor Q2 is coupled between the storage node ND1_$n$ and the bit line/BL. The gates of the MOS transistors Q1, Q2 are coupled to the word line WLX.

The Y cell 14 includes inverters INV3, INV4 and MOS (metal oxide semiconductor) transistors Q3, Q4. The inverter INV3 is coupled between the storage node ND2 and the storage node ND2_$n$ so that the direction from the storage node ND2_$n$ to the storage node ND2 is a forward direction. The inverter INV4 is coupled in parallel with the inverter INV3 and oriented in an opposite direction to the inverter INV3. The MOS transistor Q3 is coupled between the storage node ND2 and the bit line BL. The MOS transistor Q4 is coupled between the storage node ND2_$n$ and the bit line/BL. The gates of the MOS transistors Q3, Q4 are coupled to the word line WLY.

The data comparison section 13 includes N-channel MOS transistors Q6-Q9. The MOS transistors Q6, Q7 are series-coupled between a node ND3 and a ground node GND. The node ND3 is a point of coupling to the match line ML. The MOS transistors Q8, Q9 are series-coupled between the node ND3 and the ground node GND, and parallel-coupled to both of the series-coupled MOS transistors Q6, Q7. The gates of the MOS transistors Q6, Q8 are respectively coupled to the storage nodes ND1, ND2. The gates of the MOS transistors Q7, Q9 are respectively coupled to the search lines SL, /SL.

FIG. 3 is a diagram illustrating, in tabular form, the association between TCAM data and contents stored in the X cell and Y cell depicted in FIG. 2.

Referring to FIGS. 2 and 3, a TCAM cell is capable of storing three values, namely "0", "1", and "*" (don't care), by using the 2-bit SRAM cells. More specifically, when "1" is stored in the storage node ND1 of the X cell 11 and "0" is stored in the storage node ND2 of the Y cell 14, it is assumed that "0" is stored in the TCAM cell. When "0" is stored in the storage node ND1 of the X cell 11 and "1" is stored in the storage node ND2 of the Y cell 14, it is assumed that "1" is stored in the TCAM cell. When "0" is stored in the storage node ND1 of the X cell 11 and "0" is stored in the storage node ND2 of the Y cell 14, it is assumed that "*" (don't care) is stored in the TCAM cell. When "1" is stored in the storage node ND1 of the X cell 11 and "1" is stored in the storage node ND2 of the Y cell 14, data in the TCAM cell is not used.

According to the above-described TCAM cell configuration, when search data is "1" (that is, the search line SL is "1" and the search line/SL is "0") and the TCAM data is "0" (the storage node ND1 is "1" and the storage node ND2 is "0"), the MOS transistors Q6, Q7 are on. Thus, the potential of a precharged match line ML is pulled down to a ground potential. When the search data is "0" (that is, the search line SL is "0" and the search line/SL is "1") and the TCAM data is "1" (the storage node ND1 is "0" and the storage node ND2 is "1"), the MOS transistors Q8, Q9 are on. Thus, the potential of the precharged match line ML is pulled down to the ground potential. That is, when the search data does not match the TCAM data, the potential of the match line ML is pulled down to the ground potential.

Conversely, when inputted search data is "1" and the TCAM data is "1" or "*", or when the search data is "0" and the TCAM data is "0" or "*" (that is, when the search data and the TCAM data match with each other), the potential of the precharged match line ML (power supply voltage VDD level) is maintained.

As described above, a TCAM is such that the potential stored in the match line ML is pulled down unless data in all TCAM cells coupled to a match line ML associated with one entry (row) matches input search data. Therefore, the TCAM performs a high-speed search, but consumes a large amount of current.

Figure 4:
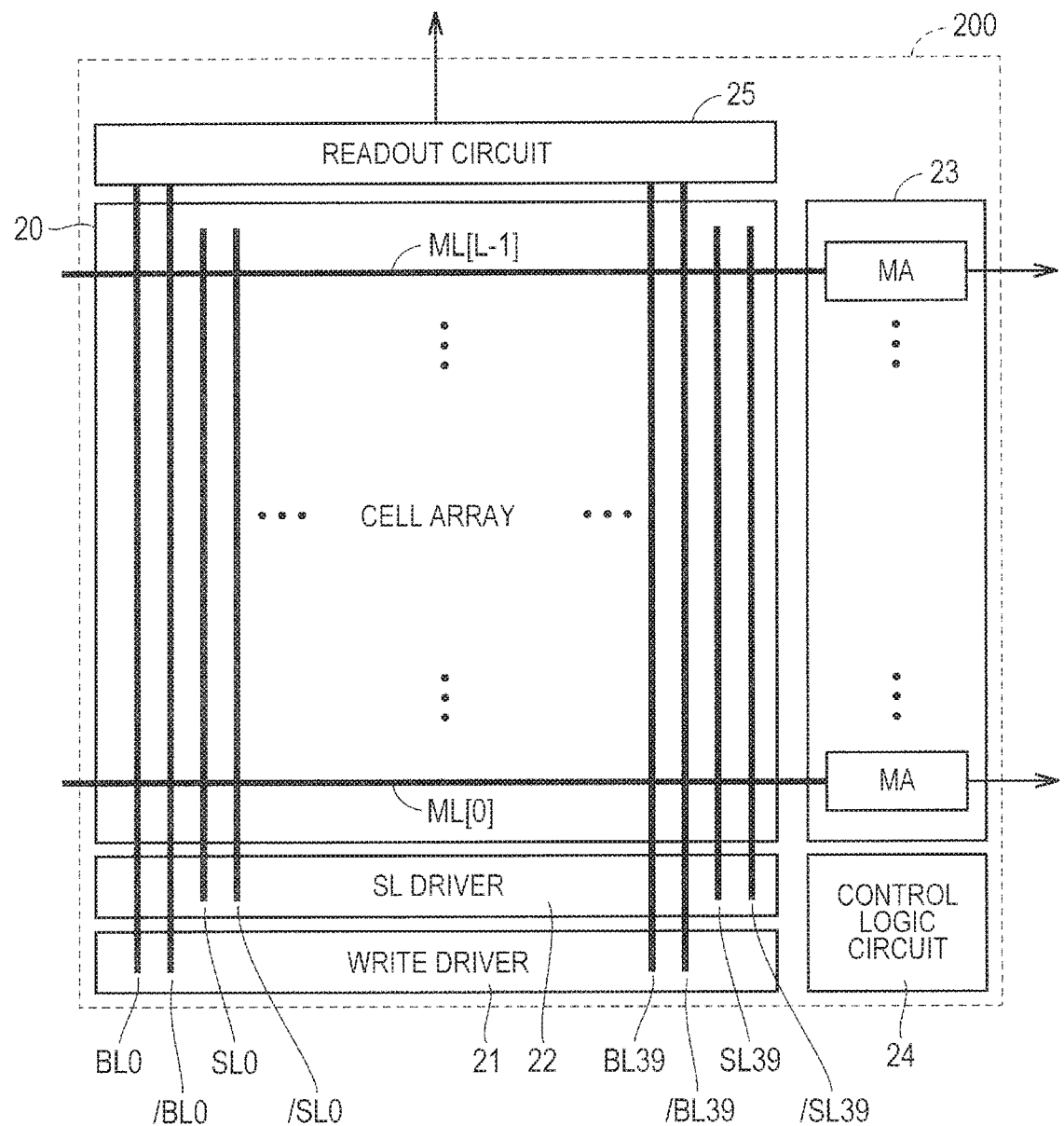
FIG. 4 is a diagram illustrating a configuration of a search block included in a search memory according to the first embodiment.

FIG. 4 is a diagram illustrating a configuration of a search block 200 included in the search memory 8 according to the first embodiment.

As illustrated in FIG. 4, the search block 200 includes the TCAM cell array 20 (simply referred to also the cell array), a write driver 21, a search line driver 22, a match amplifier section 23, a control logic circuit 24, and a readout circuit 25.

Although not depicted, the search block 200 includes a word line driver (not depicted) and an input/output circuit (not depicted). The word line driver drives the word lines WLX, WLY. The input/output circuit receives, for example, inputted control signals and address signals.

The TCAM cell array 20 includes TCAM cells that are arrayed in matrix form (j rows and k columns). In the present example, the depicted cell array 20 is such that the number of rows (the number of entries) j is L, and that the number of columns (the number of bits) k is 40. It should be noted that the cell array 20 includes at least one redundant memory cell column.

In association with the columns of the cell array 20, k (k=40) bit line pairs (BL0 and/BL0 to BL(k−1) and/BL(k−1)) and k (k=40) search line pairs (SL0 and/SL0 to SL(k−1) and/SL(k−1)) are disposed.

In association with the rows of the cell array 20, m (m=N) match lines (ML0 to ML(L−1)), m X-cell word lines (WLX0 to WLX(L−1)) (not depicted), and m Y-cell word lines (WLY0 to WLY(L−1)) (not depicted) are disposed.

During a write operation, the write driver 21 supplies write data to each TCAM cell through the pair of bit lines BL, /BL. During a search operation, the search line driver 22 supplies search data to each TCAM cell through the pair of search lines SL, /SL.

The control logic circuit 24 controls the overall operation of the search block 200. During a search operation, the control logic circuit 24 receives a search command and outputs a control signal to the search line driver 22 and the match amplifier section 23 in order to control the operations of the search line driver 22, the match amplifier section 23, and a precharge circuit. During a readout operation, the control logic circuit 24 receives a read command and outputs a control signal for controlling the readout circuit 25. Thus, entry data stored in the cell array 20 can be read out and outputted.

The match amplifier section 23 includes multiple match amplifiers MA that are associated with the rows of the cell array. During a search operation, the match amplifiers MA detect, in accordance with the potential of an associated match line ML, whether the associated portion of the input search data matches associated TCAM cell data. In the present embodiment, the match amplifiers MA each include a precharge circuit for precharging the associated match line ML during a search operation.

Figure 5:
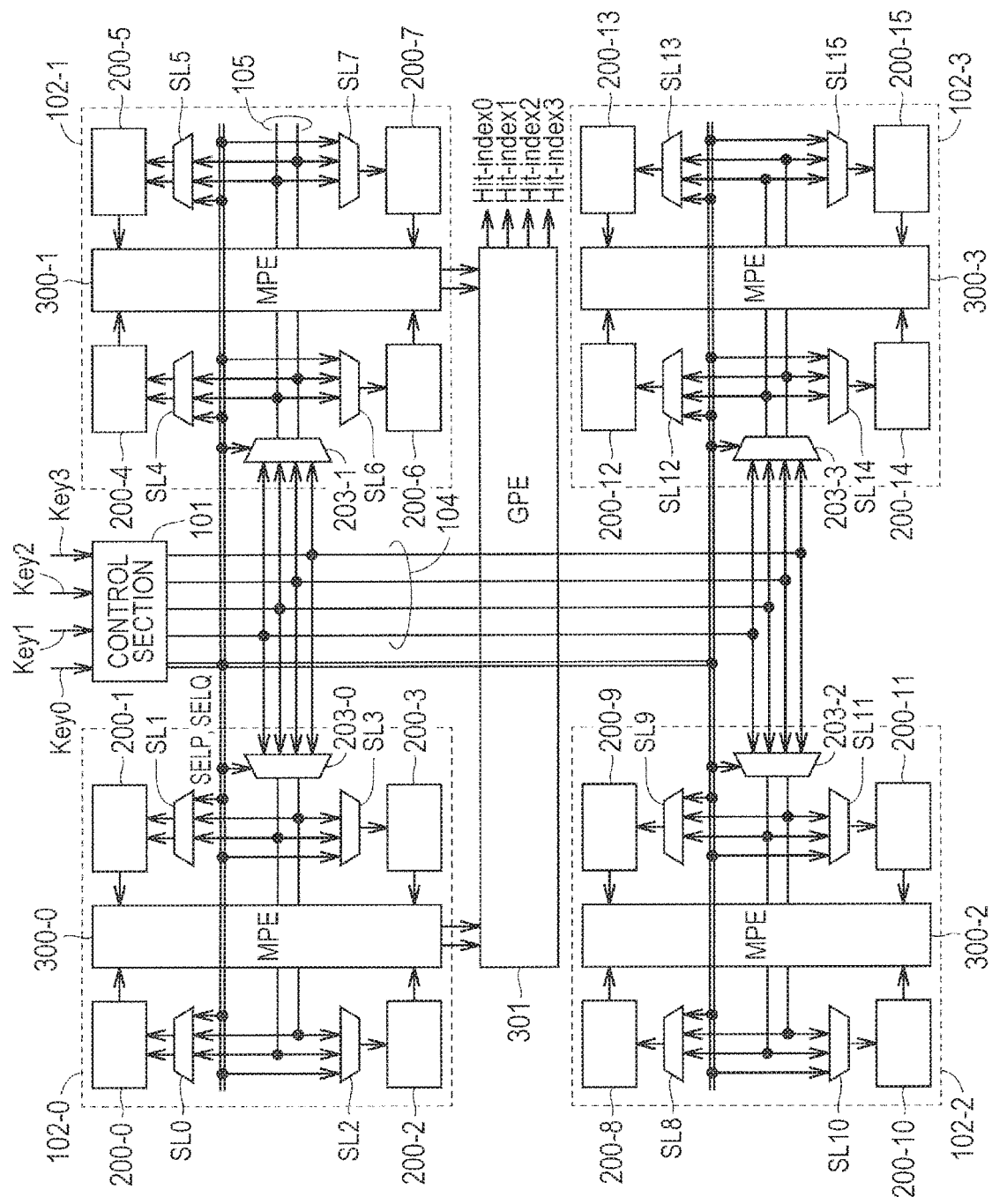
FIG. 5 is a diagram illustrating a configuration of search units included in the search memory according to the first embodiment.

FIG. 5 is a diagram illustrating a configuration of multiple search units included in the search memory 8 according to the first embodiment.

Referring to FIG. 5, the search units 102-0 to 102-3 (hereinafter generically referred to also as the search units 102), a control section 101, and a global priority encoder (GPE) 301 are disposed.

The control section 101 parallelly receives the inputs of multiple input search data keys 0 to 3 (hereinafter generically referred to also as the input search data keys).

The control section 101 respectively outputs input search data keys 0 to 3 to the search units 102.

The control section 101 outputs select signals SELP and SELQ to each of the search units 102.

The search units each include multiple search blocks 200.

The search unit 102-0 includes search blocks 200-0 to 200-3 (generically referred to also as the search blocks 200), a selector 203-0, a medium priority encoder (MPE) 300-0, and selectors SL0-SL3 (generically referred to also as the selectors SL).

The selectors SL0-SL3 are respectively disposed in association with the search blocks 200-0 to 200-3.

The selector 203-0 receives the inputs of input search data keys 0 to 3, and outputs two input search data keys to each selector SL in accordance with the inputs of select signals SELQ0, SELQ1.

The selectors SL0-SL3 receive the inputs of two input search data keys, and output either one of the two input search data keys to an associated search block 200 in accordance with the inputs of select signals SELP0-SELP3.

The associated search block 200 executes a search operation on the input search data key inputted from the selectors SL.

The associated search block 200 outputs address information (hit-index) associated with a matched match line to the medium priority encoder (MPE) 300-0.

The medium priority encoder 300-0 receives the address information (hit-index) outputted from the search blocks 200-0 to 200-3, and outputs high-priority address information to the global priority encoder (GPE) 301.

The search unit 102-1 includes search blocks 200-4 to 200-7, a selector 203-1, a medium priority encoder (MPE) 300-1, and selectors SL4-SL7.

The selectors SL4-SL7 are respectively disposed in association with the search blocks 200-4 to 200-7.

The selector 203-1 receives the inputs of input search data keys 0 to 3, and outputs two input search data keys to each selector SL in accordance with the inputs of select signals SELQ2, SELQ3.

The selectors SL4-SL7 receive the inputs of two input search data keys, and output either one of the two input search data keys to an associated search block 200 in accordance with the inputs of select signals SELP4-SELP7.

The associated search block 200 executes a search operation on the input search data key inputted from the selectors SL.

The associated search block 200 outputs address information (hit-index) associated with a matched match line to the medium priority encoder (MPE) 300-1.

The medium priority encoder 300-1 receives the address information (hit-index) outputted from the search blocks 200-4 to 200-7, and outputs high-priority address information to the global priority encoder (GPE) 301.

The search unit 102-2 includes search blocks 200-8 to 200-11, a selector 203-2, a medium priority encoder (MPE) 300-2, and selectors SL8-SL11.

The selectors SL8-SL11 are respectively disposed in association with the search blocks 200-8 to 200-11.

The selector 203-2 receives the inputs of input search data keys 0 to 3, and outputs two input search data keys to each selector SL in accordance with the inputs of select signals SELQ4, SELQ5.

The selectors SL8-SL11 receive the inputs of two input search data keys, and output either one of the two input search data keys to an associated search block 200 in accordance with the inputs of select signals SELP8-SELP11.

The associated search block 200 executes a search operation on the input search data key inputted from the selectors SL.

The associated search block 200 outputs address information (hit-index) associated with a matched match line to the medium priority encoder (MPE) 300-2.

The medium priority encoder 300-2 receives the address information (hit-index) outputted from the search blocks 200-8 to 200-11, and outputs high-priority address information to the global priority encoder (GPE) 301.

The search unit 102-3 includes search blocks 200-12 to 200-15, a selector 203-3, a medium priority encoder (MPE) 300-3, and selectors SL12-SL15.

The selectors SL12-SL15 are respectively disposed in association with the search blocks 200-12 to 200-15.

The selector 203-3 receives the inputs of input search data keys 0 to 3, and outputs two input search data keys to each selector SL in accordance with the inputs of select signals SELQ6, SELQ7.

The selectors SL12-SL15 receive the inputs of two input search data keys, and output either one of the two input search data keys to an associated search block 200 in accordance with the inputs of select signals SELP12-SELP15.

The associated search block 200 executes a search operation on the input search data key inputted from the selectors SL.

The associated search block 200 outputs address information (hit-index) associated with a matched match line to the medium priority encoder (MPE) 300-3.

The medium priority encoder 300-3 receives the address information (hit-index) outputted from the search blocks 200-12 to 200-15, and outputs high-priority address information to the global priority encoder (GPE) 301.

The global priority encoder (GPE) 301 receives the outputs of multiple medium priority encoders 300-0 to 300-3 and eventually outputs high-priority address information. In the present example, multiple sets of address information (hit-index 0 to hit-index 3) are respectively outputted for multiple input search data keys 0 to 3.

Figures 6A, 6B:
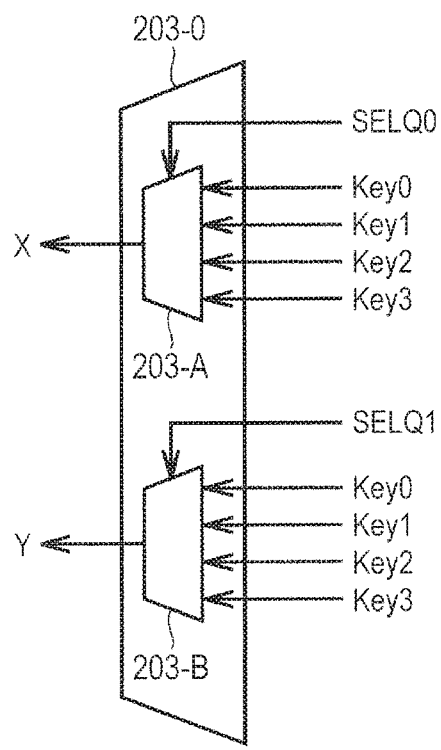
FIGS. 6A and 6B are diagrams illustrating a configuration of a selector 203-0 according to the first embodiment.

FIGS. 6A and 6B are diagrams illustrating a configuration of the selector 203-0 according to the first embodiment.

Referring to FIG. 6A, the selector 203-0 includes select circuits 203A, 203B.

The select circuit 203A receives multiple input search data keys 0 to 3, selects one of the input search data keys 0 to 3 in accordance with the input of the select signal SELQ0, and outputs the selected input search data key as an output signal X.

The select circuit 203B receives multiple input search data keys 0 to 3, selects one of the input search data keys 0 to 3 in accordance with the input of the select signal SELQ1, and outputs the selected input search data key as an output signal Y.

The select signals SELQ0, SELQ1 are 2-bit control signals.

FIG. 6B illustrates the relationship between the select signals SELQ and the output signals to be selected.

When the select signals SELQ0, SELQ1 are "00", input search data key 0 is selected.

When the select signals SELQ0, SELQ1 are "01", input search data key 1 is selected.

When the select signals SELQ0, SELQ1 are "10", input search data key 2 is selected.

When the select signals SELQ0, SELQ1 are "11", input search data key 3 is selected.

The configurations of the other selectors 203-1 to 203-3 are the same as that of the selector 203-0 and will not be redundantly described in detail.

Figures 7A, 7B:
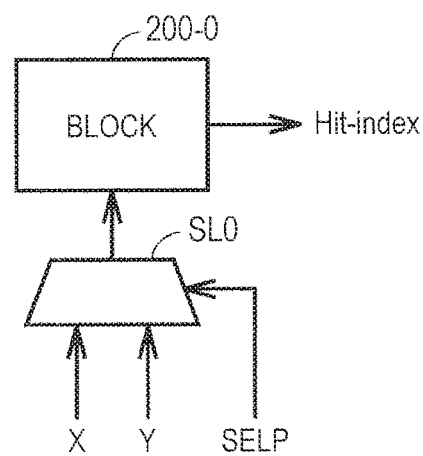
FIGS. 7A and 7B are diagrams illustrating a configuration of a selector SL-0 according to the first embodiment.

FIGS. 7A and 7B are diagrams illustrating a configuration of the selector SL0 according to the first embodiment.

Referring to FIG. 7A, the selector SL0 receives the inputs of the output signals X, Y, selects one of the output signals X, Y in accordance with the input of the select signal SELP0, and outputs the selected output signal to the search block 200-0.

The select signal SELP0 is a 1-bit control signal.

FIG. 7B illustrates the relationship between the select signal SELP0 and the output signals to be selected.

When the select signal SELP0 is "0", the signal X is selected and outputted.

When the select signal SELP0 is "1", the signal Y is selected and outputted.

The configurations of the other selectors SL1 to SL15 are the same as that of the selector SL0 and will not be redundantly described in detail.

FIGS. 8A and 8B are diagrams illustrating a configuration of the medium priority encoder 300-0 according to the first embodiment.

Referring to FIG. 8A, the medium priority encoder 300-0 includes switch circuits SW0-SW3 and priority encoders 300A, 300B.

The switch circuits SW0-SW3 selects one of two inputted sets of address information (hit-index) in accordance with the select signals SELP0-SELP3, and outputs the selected set of address information (hit-index) to either one of the priority encoders 300A, 300B.

FIG. 8B illustrates the relationship between the select signal SELP0 and the priority encoder to which the address information (hit-index) is outputted.

When the select signal SELP0 is "0", the address information (hit-index) is outputted to the priority encoder 300A.

When the select signal SELP0 is "1", the address information (hit-index) is outputted to the priority encoder 300B.

The priority encoders 300A, 300B select high-priority information from the inputted sets of address information (hit-index), and outputs the selected high-priority information.

The present example is described in conjunction, for instance, with a case where the priority encoder 300A outputs address information (hit-index X) and the priority encoder 300B outputs address information (hit-index Y).

Figures 9A, 9B:
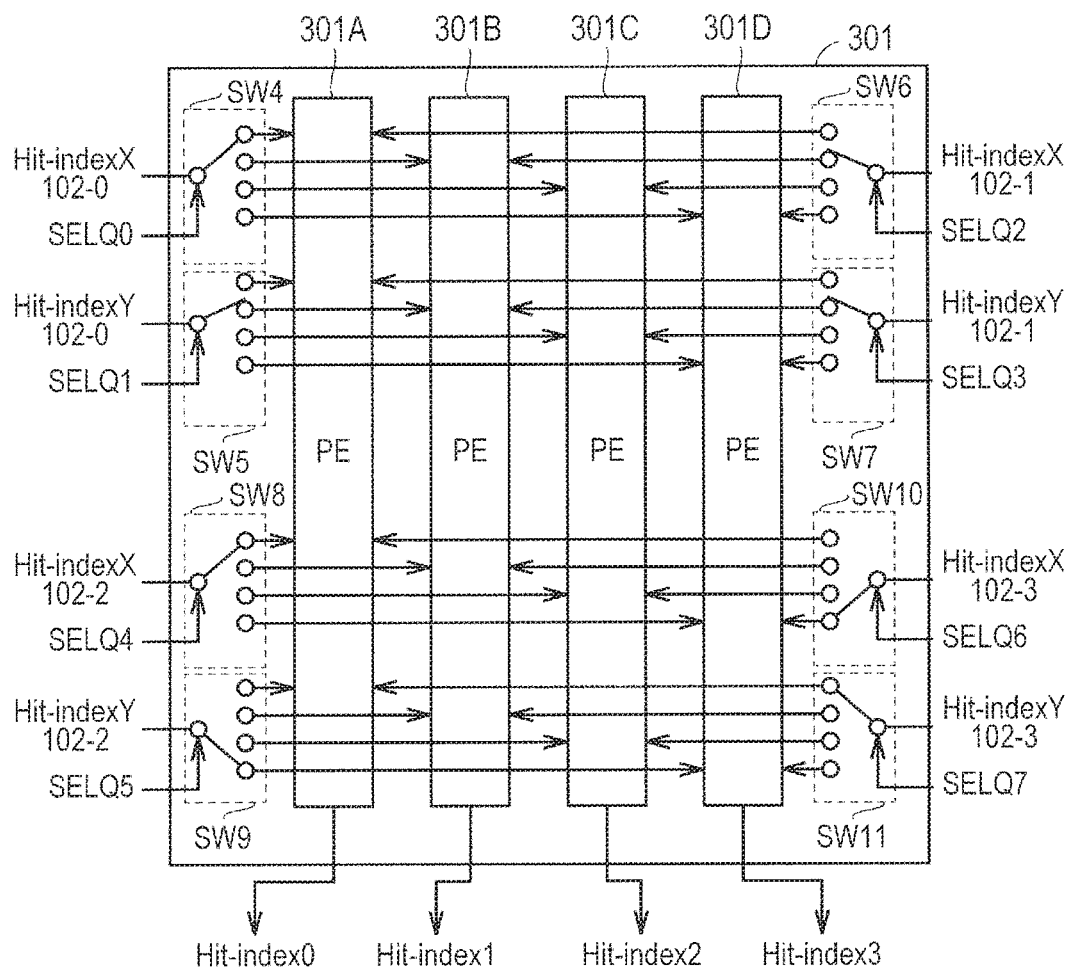
FIGS. 9A and 9B are diagrams illustrating a configuration of a priority encoder according to the first embodiment.

FIGS. 9A and 9B are diagrams illustrating a configuration of the priority encoder 301 according to the first embodiment.

Referring to FIG. 9A, the priority encoder 301 includes switch circuits SW4-SW11 and priority encoders 301A-301D.

In accordance with the inputs of the select signals SELQ0-SELQ7, the switch circuits SW4-SW11 output inputted address information (hit-index) to one of the priority encoders 301A-301D.

The switch circuit SW4 outputs inputted address information (hit-index X) to one of the priority encoders 301A-301D in accordance with the select signal SELQ0.

The switch circuit SW5 outputs inputted address information (hit-index Y) to one of the priority encoders 301A-301D in accordance with the select signal SELQ1.

The switch circuit SW6 outputs inputted address information (hit-index X) to one of the priority encoders 301A-301D in accordance with the select signal SELQ2.

The switch circuit SW7 outputs inputted address information (hit-index Y) to one of the priority encoders 301A-301D in accordance with the select signal SELQ3.

The switch circuit SW8 outputs inputted address information (hit-index X) to one of the priority encoders 301A-301D in accordance with the select signal SELQ4.

The switch circuit SW9 outputs inputted address information (hit-index Y) to one of the priority encoders 301A-301D in accordance with the select signal SELQ5.

The switch circuit SW10 outputs inputted address information (hit-index X) to one of the priority encoders 301A-301D in accordance with the select signal SELQ6.

The switch circuit SW11 outputs inputted address information (hit-index Y) to one of the priority encoders 301A-301D in accordance with the select signal SELQ7.

The priority encoders 301A-301D eventually select high-priority address information from the inputted address information and output the selected high-priority address information. In the present example, the priority encoders 301A-301D respectively output multiple sets of address information (hit-index 0 to hit-index 3).

FIG. 9B illustrates the relationship between the select signals SELQ and the priority encoders (PE) to which the address information is outputted.

The select signals SELQ0-SELQ7 are 2-bit control signals. For example, when the select signals SELQ0-SELQ7 are "00", the switch circuits SW4-SW11 output inputted address information (hit-index) to the priority encoder 301A. When the select signals SELQ0-SELQ7 are "01", the switch circuits SW4-SW11 output the inputted address information (hit-index) to the priority encoder 301B. When the select signals SELQ0-SELQ7 are "10", the switch circuits SW4-SW11 output the inputted address information (hit-index) to the priority encoder 301C.

When the select signals SELQ0-SELQ7 are "11", the switch circuits SW4-SW11 output the inputted address information (hit-index) to the priority encoder 301D.

The allocation of entry data to the search blocks 200 will now be described.

Figure 10A:
FIGS. 10A and 10B are diagrams illustrating the allocation of entry data to search blocks.
Figure 10B:

FIGS. 10A and 10B are diagrams illustrating the allocation of entry data to the search blocks 200.

FIG. 10A indicates the number of search blocks 200 to which entry data for executing a search operation on input search data keys 0 to 3 are allocated.

More specifically, indicated is a case where four search blocks 200 are allocated for storing entry data for input search data key 0 and four search blocks 200 are allocated for storing entry data for input search data key 1. Further indicated is a case where four search blocks 200 are allocated for storing entry data for input search data key 2 and four search blocks 200 are allocated for storing entry data for input search data key 3.

In the above instance, the search blocks 200-0 to 200-3 for storing entry data for input search data key 0 are allocated to the search unit 102-0. The search blocks 200-4 to 200-7 for storing entry data for input search data key 1 are allocated to the search unit 102-1. The search blocks 200-8 to 200-11 for storing entry data for input search data key 2 are allocated to the search unit 102-2. The search blocks 200-12 to 200-15 for storing entry data for input search data key 3 are allocated to the search unit 102-3.

FIG. 10B indicates the number of search blocks 200 that are allocated to entry data for executing a search operation on input search data keys 0 to 3.

More specifically, indicated is a case where six search blocks 200 are allocated for storing entry data for input search data key 0 and five search blocks 200 are allocated for storing entry data for input search data key 1. Further indicated is a case where three search blocks 200 are allocated for storing entry data for input search data key 2 and two search blocks 200 are allocated for storing entry data for input search data key 3.

In the above instance, the search blocks 200-0 to 200-3 (four search blocks) for storing entry data for input search data key 0 are allocated to the search unit 102-0.

The search blocks 200-4, 200-5 (two search blocks) for storing entry data for input search data key 0 and the search blocks 200-6, 200-7 (two search blocks) for storing entry data for input search data key 1 are allocated to the search unit 102-1.

The search blocks 200-8, 200-9, 200-10 (three search blocks) for storing entry data for input search data key 1 and the search block 200-11 (one search block) for storing entry data for input search data key 2 are allocated to the search unit 102-2.

The search blocks 200-12, 200-13 (two search blocks) for storing entry data for input search data key 2 and the search blocks 200-14, 200-15 (two search blocks) for storing entry data for input search data key 3 are allocated to the search unit 102-3.

FIGS. 11A and 11B are conceptual diagrams illustrating the search blocks 200 that store entry data associated with input search data keys according to the first embodiment.

Referring to FIG. 11A, entry data associated with input search data keys are stored in the search blocks 200 in accordance with the allocation indicated in FIG. 10A.

The present example indicates a case where entry data for one type of input search data key is stored with respect to each search unit 102.

Referring to FIG. 11B, entry data associated with input search data keys are stored in the search blocks 200 in accordance with the allocation indicated in FIG. 10B.

The present example indicates a case where entry data for two types of input search data key are stored with respect to some search units 102.

More specifically, the search blocks 200 (two search blocks) for storing entry data for input search data key 0 and the search blocks 200 (two search blocks) for storing entry data for input search data key 1 are allocated to the search unit 102-1.

The search blocks 200 (three search blocks) for storing entry data for input search data key 1 and the search block

200 (one search block) for storing entry data for input search data key 2 are allocated to the search unit 102-2.

The search blocks 200 (two search blocks) for storing entry data for input search data key 2 and the search blocks 200 (two search blocks) for storing entry data for input search data key 3 are allocated to the search unit 102-3.

When the above allocation method is used, each search unit 102 is capable of storing two types of entry data.

Consequently, four types of input search data key need not be inputted to the respective search blocks 200. Therefore, the width of a data bus can be reduced. Further, reducing the data bus width makes it possible to reduce the amount of power consumption.

Figure 12:
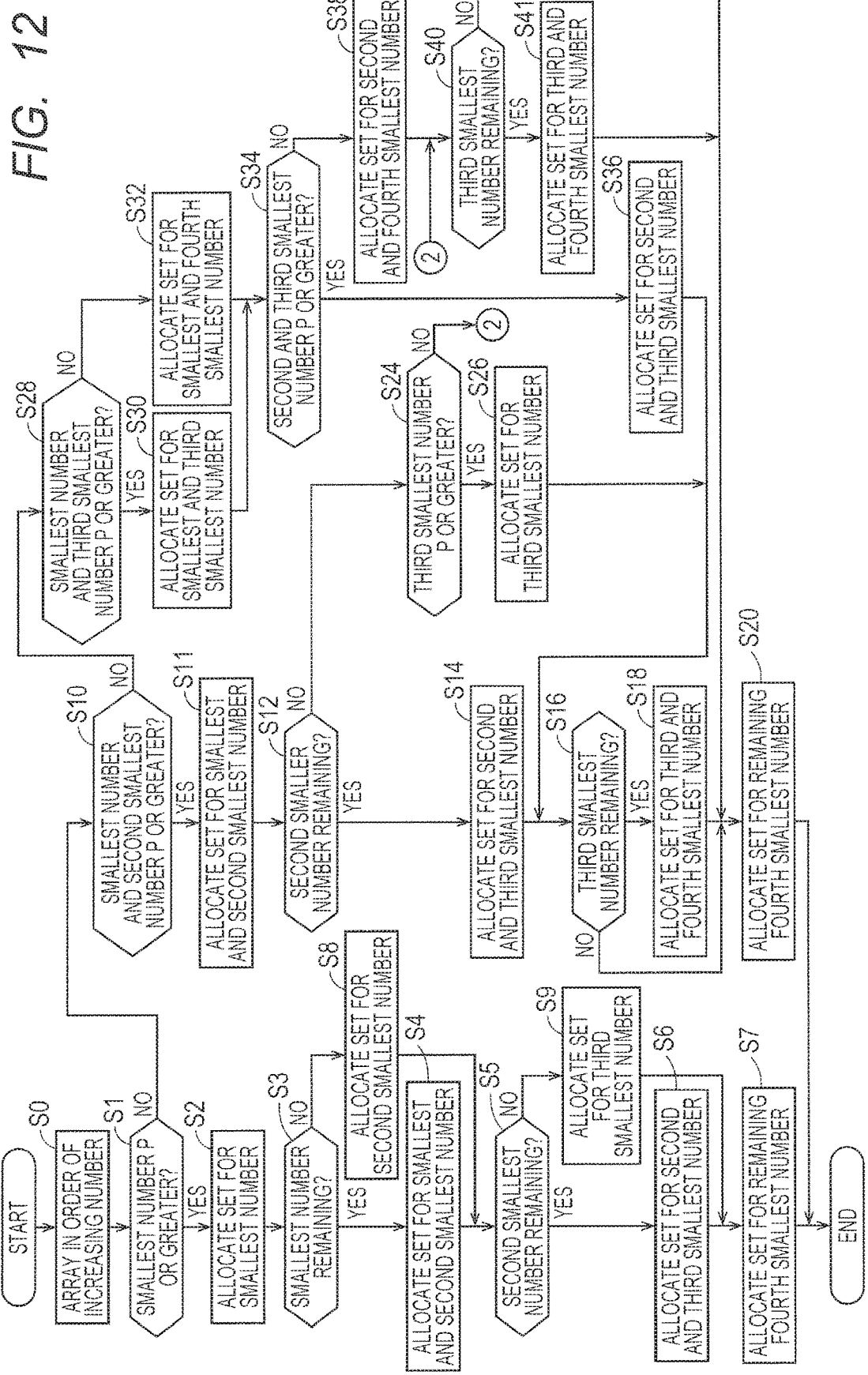
FIG. 12 is a flowchart illustrating an allocation method for the search blocks according to the first embodiment.

FIG. 12 is a flowchart illustrating an allocation method for the search blocks 200 according to the first embodiment.

The flowchart of FIG. 12 illustrates a method that enables one search unit 102 to store two types of entry data. Here, it is assumed that one search unit 102 includes P search blocks.

Referring to FIG. 12, at the time of allocation, the search blocks 200 are arrayed in order of increasing number of search blocks 200 for storing entry data associated with input search data keys 0 to 3 (step S0). More specifically, the search blocks 200 are arrayed in order of increasing number of allocated search blocks 200.

Next, a check is performed to determine whether the number of search blocks 200 allocated for storing entry data associated with the smallest number of input search data is P or greater (step S1). Let us assume, for example, that P is equal to 4. A check is performed to determine whether the number of search blocks 200 allocated for storing entry data associated with the smallest number of input search data is 4 or greater.

If it is determined in step S1 that the number of search blocks 200 allocated for storing entry data associated with the smallest number of input search data is P or greater ("YES" at step S1), a set of search blocks 200 for storing entry data associated with the smallest number of input search data is allocated as the search blocks in one search unit (step S2).

Next, a check is performed to determine whether the number of search blocks 200 allocated for storing entry data associated with the smallest number of input search data is greater than P. That is, a check is performed to determine whether there are search blocks 200 for storing entry data associated with the remaining smallest number of input search data keys in excess of P (step S3).

The following describes a case where there are search blocks 200 for storing entry data associated with the remaining smallest number of input search data keys in excess of P ("YES" at step S3). In this case, a set of search blocks 200 for storing entry data associated with the remaining smallest number of input search data keys and entry data associated with the second smallest number of input search data keys is allocated as the search blocks 200 in the next search unit (step S4).

Next, a check is performed to determine whether there are search blocks 200 for storing entry data associated with the remaining second smallest number of input search data keys (step S5).

The following describes a case where there are search blocks 200 for storing entry data associated with the remaining second smallest number of input search data keys ("YES" at step S5). In this case, a set of search blocks 200 for storing entry data associated with the second and third smallest number of input search data keys is allocated as the search blocks 200 in the next search unit (step S6).

Next, a set of search blocks 200 for storing entry data associated with the remaining fourth smallest number of input search data is allocated (step S7).

Processing then terminates (END).

Meanwhile, the following describes a case where it is determined in step S3 that there are no search blocks 200 for storing entry data associated with the remaining smallest number of input search data keys, that is, a case where the number of search blocks for storing entry data associated with the smallest number of input search data keys is P or greater ("NO" at step S3). In this case, a set of search blocks 200 for storing entry data associated with the second smallest number of input search data keys is allocated as the search blocks 200 in the next search unit (step S8).

Processing then proceeds to step S5.

Meanwhile, the following describes a case where it is determined in step S5 that there are no search blocks 200 for storing entry data associated with the remaining second smallest number of input search data keys ("NO" at step S5). In this case, a set of search blocks 200 for storing entry data associated with the third smallest number of input search data keys is allocated as the search blocks in another search unit (step S9).

Processing then proceeds to step S7.

Upon completion of step S7, processing terminates (END).

The following describes a case where, for example, four search blocks 200 are allocated for storing entry data associated with the smallest number of input search data and four search blocks 200 are allocated for storing entry data associated with the second smallest number of input search data. Further, the following describes a case where four search blocks 200 are allocated for storing entry data associated with the third smallest number of input search data and four search blocks 200 are allocated for storing entry data associated with the fourth smallest number of input search data.

In the above instance, in step S2, a set of four search blocks 200 for storing entry data associated with the smallest number of input search data is allocated. Further, in step S8, a set of four search blocks 200 for storing entry data associated with the second smallest number of input search data is allocated. Furthermore, in step S9, a set of four search blocks 200 for storing entry data associated with the third smallest number of input search data is allocated. Moreover, in step S7, a set of four search blocks 200 for storing entry data associated with the fourth smallest number of input search data is allocated.

Next, the following describes a case where it is determined that the number of search blocks 200 allocated for storing entry data associated with the smallest number of input search data is P or greater ("NO" at step S1). In this case, a check is performed to determine whether the total number of search blocks 200 for storing entry data associated with the smallest and second smallest number of input search data keys is P or greater (step S10). Let us assume, for example, that P is equal to 4. A check is performed to determine whether the total number of search blocks 200 for storing entry data associated with the smallest and second smallest number of input search data keys is 4 or greater.

The following describes a case where it is determined in step S10 that the total number of search blocks 200 for storing entry data associated with the smallest and second smallest number of input search data keys is P or greater ("YES" at step S10). In this case, a set of search blocks 200 for storing entry data associated with the smallest and second smallest number of input search data keys is allocated as the search blocks in one search unit (step S11).

Next, a check is performed to determine whether there are search blocks 200 for storing entry data associated with the remaining second smallest number of input search data keys (step S12).

The following describes a case where it is determined in step S12 that there are search blocks 200 for storing entry data associated with the remaining second smallest number of input search data keys ("YES" at step S12). In this case, a set of search blocks 200 for storing entry data associated with the second and third smallest number of input search data is allocated as the search blocks in the next search unit (step S14).

Next, a check is performed to determine whether there are search blocks 200 for storing entry data associated with the remaining third smallest number of input search data (step S16). The following describes a case where it is determined in step S16 that there are search blocks 200 for storing entry data associated with the remaining third smallest number of input search data ("YES" at step S16). In this case, a set of search blocks 200 for storing entry data associated with the third and fourth smallest number of input search data is allocated as the search blocks in the next search unit (step S18).

Next, a set of search blocks 200 for storing entry data associated with the remaining fourth smallest number of input search data is allocated (step S20).

Processing then terminates (END).

The following describes a case where, for example, two search blocks 200 are allocated for storing entry data associated with the smallest number of input search data and three search blocks 200 are allocated for storing entry data associated with the second smallest number of input search data. Further, the following describes a case where five search blocks 200 are allocated for storing entry data associated with the third smallest number of input search data and six search blocks 200 are allocated for storing entry data associated with the fourth smallest number of input search data.

In the above instance, in step S11, a set of two search blocks 200 for storing entry data associated with the smallest number of input search data and two search blocks 200 for storing entry data associated with the second smallest number of input search data is allocated as the search blocks in one search unit. Next, in step S14, a set of one search block 200 for storing entry data associated with the second smallest number of input search data and three search blocks 200 for storing entry data associated with the third smallest number of input search data is allocated as the search blocks in the next search unit. Next, in step S18, a set of two search blocks 200 for storing entry data associated with the third smallest number of input search data and two search blocks 200 for storing entry data associated with the fourth smallest number of input search data is allocated as the search blocks in the next search unit. Further, in step S20, a set of four search blocks 200 for storing entry data associated with the remaining fourth smallest number of input search data is allocated.

Meanwhile, the following describes a case where it is determined that the total number of search blocks 200 for storing entry data associated with the smallest and second smallest number of input search data is not P or greater ("NO" at step S10). In this case, a check is performed to determine whether the total number of search blocks 200 for storing entry data associated with the smallest and third smallest number of input search data is P or greater (step S28).

The following describes a case where it is determined in step S28 that the total number of search blocks 200 for storing entry data associated with the smallest and third smallest number of input search data is P or greater ("YES" at step S28). In this case, a set of search blocks 200 for storing entry data associated with the smallest and third smallest number of input search data is allocated (step S30).

Next, in step S34, a check is performed to determine whether the total number of search blocks 200 for storing entry data associated with the second and third smallest number of input search data is P or greater (step S34).

If it is determined in step S34 that the total number of search blocks 200 for storing entry data associated with the second and third smallest number of input search data is P or greater ("YES" at step S34), a set of search blocks 200 for storing entry data associated with the second and third smallest number of input search data is allocated (step S36).

Processing then proceeds to step S16.

The following describes a case where, for example, one search block 200 is allocated for storing entry data associated with the smallest number of input search data and one search block 200 is allocated for storing entry data associated with the second smallest number of input search data. Further, the following describes a case where six search blocks 200 are allocated for storing entry data associated with the third smallest number of input search data and eight search blocks 200 are allocated for storing entry data associated with the fourth smallest number of input search data.

In the above instance, allocated in step S30 is a set of one search block 200 for storing entry data associated with the smallest number of input search data and three search blocks 200 for storing entry data associated with the third smallest number of input search data. Next, allocated in step S36 is a set of one search block 200 for storing entry data associated with the second smallest number of input search data and three search blocks 200 for storing entry data associated with the third smallest number of input search data.

Meanwhile, if it is determined in step S28 that the total number of search blocks 200 for storing entry data associated with the smallest and third smallest number of input search data is not P or greater ("NO" at step S28), a set of search blocks 200 for storing entry data associated with the smallest and fourth smallest number of input search data is allocated (step S32).

Next, if it is determined in step S34 that the total number of search blocks 200 for storing entry data associated with the second and third smallest number of input search data is not P or greater ("NO" at step S34), a set of search blocks 200 for storing entry data associated with the second and fourth smallest number of input search data is allocated (step S38).

Next, a check is performed to determine whether there are search blocks 200 for storing entry data associated with the remaining third smallest number of input search data (step S40).

If it is determined in step S40 that there are search blocks 200 for storing entry data associated with the remaining third smallest number of input search data ("YES" at step S40), a set of search blocks 200 for storing entry data associated with the third and fourth smallest number of input search data is allocated (step S41).

The following describes a case where, for example, one search block 200 is allocated for storing entry data associated with the smallest number of input search data and two search blocks 200 are allocated for storing entry data associated with the second smallest number of input search data. Further, the following describes a case where four search blocks 200 are allocated for storing entry data associated with the third smallest number of input search data and nine search blocks 200 are allocated for storing entry data associated with the fourth smallest number of input search data.

In the above instance, allocated in step S32 is a set of one search block 200 for storing entry data associated with the smallest number of input search data and three search blocks 200 for storing entry data associated with the third smallest number of input search data. Next, allocated in step S38 is a set of two search blocks 200 for storing entry data associated with the second smallest number of input search data and two search blocks 200 for storing entry data associated with the fourth smallest number of input search data. Next, allocated is a set of one remaining search block 200 for storing entry data associated with the third smallest number of input search data and three search blocks 200 for storing entry data associated with the fourth smallest number of input search data.

Processing then proceeds to step S20.

Meanwhile, if it is determined in step S40 that there are no search blocks 200 for storing entry data associated with the remaining third smallest number of input search data ("NO" at step S40), processing proceeds to step S20.

The following describes a case where, for example, one search block 200 is allocated for storing entry data associated with the smallest number of input search data and one search block 200 is allocated for storing entry data associated with the second smallest number of input search data. Further, the following describes a case where three search blocks 200 are allocated for storing entry data associated with the third smallest number of input search data and eleven search blocks 200 are allocated for storing entry data associated with the fourth smallest number of input search data.

In the above instance, allocated in step S30 is a set of one search block 200 for storing entry data associated with the smallest number of input search data and three search blocks 200 for storing entry data associated with the third smallest number of input search data. Next, allocated in step S38 is a set of one search block 200 for storing entry data associated with the second smallest number of input search data and three search blocks 200 for storing entry data associated with the fourth smallest number of input search data. Processing then proceeds to step S20.

Meanwhile, if it is determined in step S12 that there are no search blocks 200 for storing entry data associated with the remaining second smallest number of input search data ("NO" at step S12), a check is performed to determine whether the number of search blocks 200 for storing entry data associated with the third smallest number of input search data is P or greater (step S24).

If it is determined in step S24 that the number of search blocks 200 for storing entry data associated with the third smallest number of input search data is P or greater ("YES" at step S24), a set of P search blocks 200 for storing entry data associated with the third smallest number of input search data is allocated (step S26).

Processing then proceeds to step S16.

The following describes a case where, for example, two search blocks 200 are allocated for storing entry data associated with the smallest number of input search data and two search blocks 200 are allocated for storing entry data associated with the second smallest number of input search data. Further, the following describes a case where four search blocks 200 are allocated for storing entry data associated with the third smallest number of input search data and eight search blocks 200 are allocated for storing entry data associated with the fourth smallest number of input search data.

In the above instance, allocated in step S11 is a set of two search blocks 200 for storing entry data associated with the smallest number of input search data and two search blocks 200 for storing entry data associated with the second smallest number of input search data. Next, allocated in step S26 is a set of four search blocks 200 for storing entry data associated with the third smallest number of input search data. Processing then proceeds to step S16.

Meanwhile, if it is determined in step S24 that the number of search blocks 200 for storing entry data associated with the third smallest number of input search data is not P or greater ("NO" at step S24), processing proceeds to step S40. The following describes a case where, for example, one search block 200 is allocated for storing entry data associated with the smallest number of input search data and three search blocks 200 are allocated for storing entry data associated with the second smallest number of input search data. Further, the following describes a case where three search blocks 200 are allocated for storing entry data associated with the third smallest number of input search data and nine search blocks 200 are allocated for storing entry data associated with the fourth smallest number of input search data.

In the above instance, allocated in step S11 is a set of one search block 200 for storing entry data associated with the smallest number of input search data and three search blocks 200 for storing entry data associated with the second smallest number of input search data. Processing then proceeds to step S40.

Meanwhile, if it is determined in step S16 that the number of search blocks 200 for storing entry data associated with the remaining third smallest number of input search data is not P or greater ("NO" at step S16), processing proceeds to step S20.

The following describes a case where, for example, two search blocks 200 are allocated for storing entry data associated with the smallest number of input search data and three search blocks 200 are allocated for storing entry data associated with the second smallest number of input search data. Further, the following describes a case where three search blocks 200 are allocated for storing entry data associated with the third smallest number of input search data and eight search blocks 200 are allocated for storing entry data associated with the fourth smallest number of input search data.

In the above instance, allocated in step S11 is a set of two search blocks 200 for storing entry data associated with the smallest number of input search data and two search blocks 200 for storing entry data associated with the second smallest number of input search data. Next, allocated in step S14 is a set of one search block 200 for storing entry data associated with the second smallest number of input search data and three search blocks 200 for storing entry data associated with the third smallest number of input search data.

Processing then proceeds to step S20.

The following describes a case depicted in FIG. 10B where the number of search blocks 200 for storing entry data associated with input search data keys 0 to 3 is 6, 5, 3, and 2, respectively.

Referring to the flowchart of FIG. 12, the search blocks 200 to be allocated are arrayed, in step S0, in order of increasing number of search blocks 200 for storing entry data associated with input search data keys 0 to 3.

More specifically, the search blocks 200 are arrayed in order of two search blocks (key 3), three search blocks (key 2), five search blocks (key 1), six search blocks (key 0).

Then, in step S2, it is determined that the number of search blocks 200 for storing entry data associated with input search data of the smallest number of input search data keys 3 is not P (P=4).

Next, in step S6, it is determined that the total number of search blocks 200 for storing entry data associated with the smallest number of input search data keys 3 and the second smallest number of input search data keys 2 is 4 or greater.

Consequently, allocated in step S8 is a set of search blocks 200 for storing entry data associated with the smallest number of input search data keys 3 and the second smallest number of input search data keys 2. More specifically, allocated is a set of two search blocks 200 for storing entry data associated with the smallest number of input search data keys 3 and two search blocks 200 for storing entry data associated with the second smallest number of input search data keys 2.

Next, in step S10, it is determined that there are search blocks 200 for storing entry data associated with the remaining second smallest number of input search data keys 2.

Subsequently, it is determined in step S12 that the total number of search blocks 200 for storing entry data associated with the second smallest number of input search data keys 2 and the third smallest number of input search data keys 1 is 4 or greater.

Consequently, allocated in step S12 is a set of search blocks 200 for storing entry data associated with the second smallest number of input search data keys 2 and the third smallest number of input search data keys 1. More specifically, allocated is a set of one search block 200 for storing entry data associated with the second smallest number of input search data keys 2 and three search blocks 200 for storing entry data associated with the third smallest number of input search data keys 1.

Subsequently, it is determined in step S16 that there are search blocks 200 for storing entry data associated with the remaining third smallest number of input search data keys 1.

Next, in step S18, allocated is a set of search blocks 200 for storing entry data associated with the third smallest number of input search data keys 1 and the fourth smallest number of input search data keys 0. More specifically, allocated is a set of two search blocks 200 for storing entry data associated with the third smallest number of input search data keys 1 and two search blocks 200 for storing entry data associated with the fourth smallest number of input search data keys 0.

Next, in step S20, allocated is a set of search blocks 200 for storing entry data associated with the remaining fourth smallest number of input search data keys. More specifically, allocated is a set of four search blocks 200 for storing entry data associated with the fourth smallest number of input search data keys 0.

In the present example, each allocated set of search blocks 200 is stored in a respective search unit 102. As an example, a set of four search blocks 200 for input search data key 0 is allocated to the search unit 102-0. A set of two search blocks 200 for input search data key 0 and two search blocks 200 for input search data key 1 is allocated to the search unit 102-1. A set of three search blocks 200 for input search data key 1 and one search block 200 for input search data key 2 is allocated to the search unit 102-2. A set of two search blocks 200 for input search data key 2 and two search blocks 200 for input search data key 3 is allocated to the search unit 102-3.

FIG. 13 is a diagram illustrating select signals allocated to the search units depicted in FIG. 10B.

Referring to FIG. 13, the select signals SELQ0, SELQ1 for the search unit 102-0 are both set to "00". The select signals SELP0-SELP3 are set to "0".

As the select signal SELQ0 is "00", the selector 203-0 outputs input search data key 0 as the output signal X. Further, as the select signal SELQ1 is "00", the selector 203-0 outputs input search data key 0 as the output signal Y.

In accordance with the select signals SELP0-SELP3 ("0"), the selectors SL0-SL3 select input search data key 0, which is the output signal X, and output the selected output signal X to the search blocks 200-0 to 200-3.

For the search unit 102-1, the select signals SELQ2, SELQ3 are respectively set to "00" and "01". The select signals SELP4, SELP5 are set to "0". The select signals SELP6, SELP7 are set to "1".

As the select signal SELQ2 is "00", the selector 203-1 outputs input search data key 0 as the output signal X. Further, as the select signal SELQ3 is "01", the selector 203-1 outputs input search data key 1 as the output signal Y.

In accordance with the select signals SELP4, SELP5 ("0"), the selectors SL4, SL5 select input search data key 0, which is the output signal X, and output the selected output signal X to the search blocks 200-4, 200-5.

In accordance with the select signals SELP6, SELP7 ("1"), the selectors SL6, SL7 select input search data key 1, which is the output signal Y, and output the selected output signal Y to the search blocks 200-6, 200-7.

For the search unit 102-2, the select signals SELQ4, SELQ5 are respectively set to "01" and "10". The select signals SELP8, SELP9, SELP10 are set to "0". The select signal SELP11 is set to "1".

As the select signal SELQ4 is "01", the selector 203-2 outputs input search data key 1 as the output signal X. Further, as the select signal SELQ5 is "10", the selector 203-2 outputs input search data key 2 as the output signal Y.

In accordance with the select signals SELP8, SELP9, SELP10 ("0"), the selectors SL8, SL9, SL10 select input search data key 1, which is the output signal X, and output the selected output signal X to the search blocks 200-8, 200-9, 200-10.

In accordance with the select signal SELP11 ("1"), the selector SL11 selects input search data key 2, which is the output signal Y, and outputs the selected output signal Y to the search block 200-11.

For the search unit 102-3, the select signals SELQ6, SELQ7 are respectively set to "10" and "11". The select signals SELP12, SELP13 are set to "0". The select signal SELP14, SELP15 are set to "1".

As the select signal SELQ6 is "10", the selector 203-3 outputs input search data key 2 as the output signal X. Further, as the select signal SELQ7 is "11", the selector 203-3 outputs input search data key 3 as the output signal Y.

In accordance with the select signals SELP12, SELP13 ("0"), the selectors SL12, SL13 select input search data key 2 as the output signal X, and output the selected output signal X to the search blocks 200-12, 200-13.

In accordance with the select signals SELP14, SELP15 ("1"), the selectors SL14, SL15 select input search data key 3 as the output signal Y, and output the selected output signal Y to the search blocks 200-14, 200-15.

The medium priority encoder 300-0 of the search unit 102-0 receives the input of address information from each of the search blocks 200-0 to 200-3. More specifically, in accordance with the input of the select signals SELP0-

SELP3, respective address information is inputted to the priority encoder 300A, and high-priority address information is outputted.

The medium priority encoder 300-1 of the search unit 102-1 receives the input of address information from each of the search blocks 200-4 to 200-7. More specifically, in accordance with the input of the select signals SELP4-SELP7, respective address information is inputted to the priority encoders 300A, 300B. The address information concerning the search blocks 200-4, 200-5 is inputted to the priority encoder 300A in accordance with the input of the select signals SELP4, SELP5 ("0"). The address information concerning the search blocks 200-6, 200-7 is inputted to the priority encoder 300B in accordance with the input of the select signals SELP6, SELP7 ("1").

The medium priority encoder 300-2 of the search unit 102-2 receives the input of address information from each of the search blocks 200-8 to 200-11. More specifically, in accordance with the input of the select signals SELP8-SELP11, respective address information is inputted to the priority encoders 300A, 300B. The address information concerning the search blocks 200-8, 200-9, 200-10 is inputted to the priority encoder 300A in accordance with the input of the select signals SELP8, SELP9, SELP10 ("0"). The address information concerning the search block 200-11 is inputted to the priority encoder 300B in accordance with the input of the select signal SELP11 ("1").

The medium priority encoder 300-3 of the search unit 102-3 receives the input of address information from each of the search blocks 200-12 to 200-15. More specifically, in accordance with the input of the select signals SELP12-SELP15, respective address information is inputted to the priority encoders 300A, 300B. The address information concerning the search blocks 200-12, 200-13 is inputted to the priority encoder 300A in accordance with the input of the select signals SELP12, SELP13 ("0"). The address information concerning the search blocks 200-14, 200-15 is inputted to the priority encoder 300B in accordance with the input of the select signals SELP14, SELP15 ("1").

The search unit 301 receives the input of address information from each of the medium priority encoders 300-0 to 300-3.

More specifically, in accordance with the input of the select signals SELQ0-SELQ7, respective address information is inputted to the priority encoders 301A-301D.

As the select signals SELQ0, SELQ1 are set to "00", the address information from the search unit 102-0 is inputted to the priority encoder 301A.

As the select signal SELQ2 is set to "00", the address information from the search unit 102-1 is inputted to the priority encoder 301A. Further, as the select signal SELQ3 is set to "01", the address information from the search unit 102-1 is inputted to the priority encoder 301B.

As the select signal SELQ4 is set to "01", the address information from the search unit 102-2 is inputted to the priority encoder 301B. Further, as the select signal SELQ5 is set to "10", the address information from the search unit 102-2 is inputted to the priority encoder 301C.

As the select signal SELQ6 is set to "10", the address information from the search unit 102-3 is inputted to the priority encoder 301C. Further, as the select signal SELQ7 is set to "11", the address information from the search unit 102-3 is inputted to the priority encoder 301D.

The priority encoders 301A-301D output high-priority address information in accordance with the inputted address information.

Address information associated with input search data key 0 is inputted to the priority encoder 301A. Address information associated with input search data key 1 is inputted to the priority encoder 301B. Address information associated with input search data key 2 is inputted to the priority encoder 301C. Address information associated with input search data key 3 is inputted to the priority encoder 301D.

When the above-described method is adopted, entry data respectively associated with input search data keys 0 to 3 can be freely allocated to the search blocks 200 with respect to the search memory to which input search data keys 0 to 3 are inputted.

Consequently, the width of a data bus can be decreased to reduce the amount of current consumption.

When four different input search data are distributed to predetermined search units for search purposes, related-art methods input four different input search data to all search blocks 200 and execute a search process.

Consequently, when search keys for K parallel searches are distributed to the search units, the related-art methods require K times the width of a data bus, that is, the bus width of input search data.

However, the first embodiment performs allocation based on a specific rule so that target search units are integrated into a particular group for each input search data. Therefore, the number of input search data required for each group can be reduced to two.

Accordingly, a hierarchical data bus is adopted so as to select two input search data from K input search data on an individual group basis and select final input search data from the two input search data selected for each search unit.

The above-described configuration can decrease the data bus width in the search units to a data bus width two times the input search data. This makes it possible to reduce the area of a chip and the amount of current consumption.

Second Embodiment

Based on a predetermined allocation rule and on the number of search blocks of a search unit for each input search data, the first embodiment, which has been described above, determines which search unit executes a search on each input search data.

As the data written into the search memory is updated over time due, for instance, to addition or deletion, the number of blocks changes.

Figure 14:
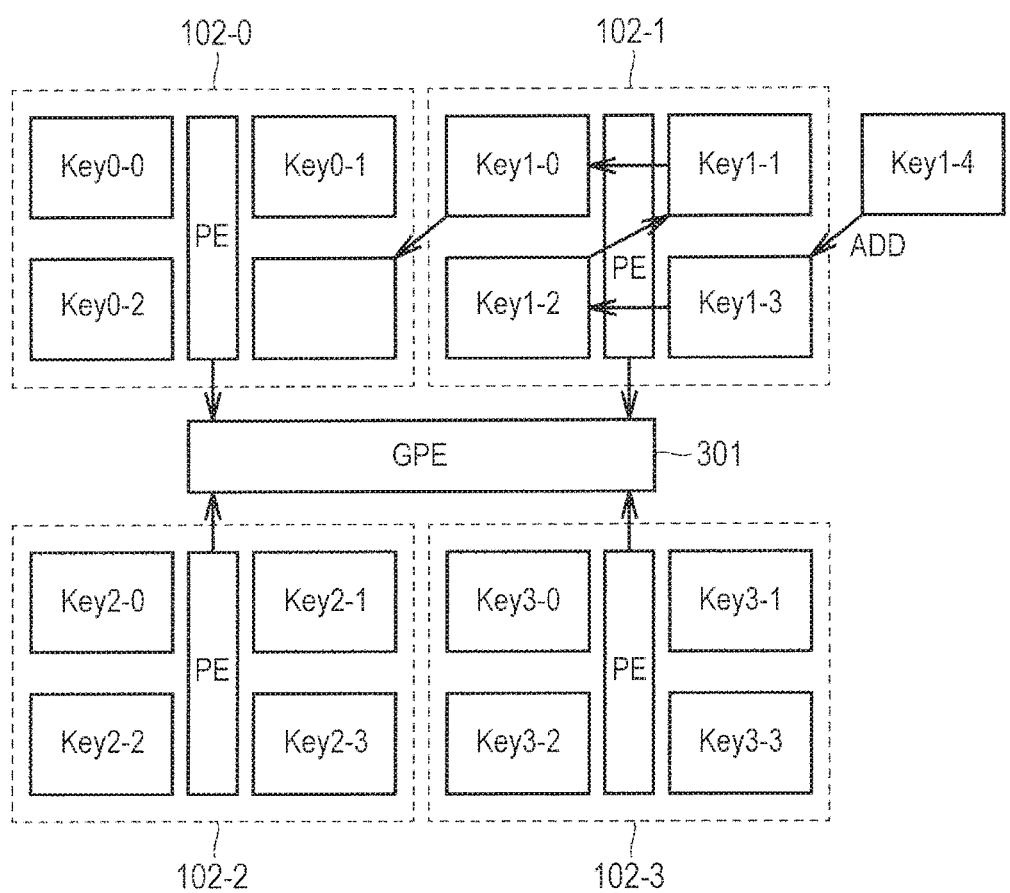
FIG. 14 is a diagram illustrating the update of data in the search memory.

FIG. 14 is a diagram illustrating the update of data in the search memory.

FIG. 14 depicts a case where data in the search block 200-3 for storing entry data associated with input search data key 0 is deleted due to an update.

The following describes a case where entry data of input search data key 1 is to be newly stored.

In this case, it is conceivable that entry data of input search data key 1 is to be stored in an unoccupied search block 200-3.

However, each search block 200 has a priority that is used as a criterion for selecting address information (hit-index) at the time of output from a priority encoder (PE).

In general, a design is made such that entry data at a low-numbered address usually has a high priority.

Consequently, the priorities of sixteen search blocks 200 are designed to become higher in order of increasing values of four high-order bits of a block address used for identifying the search blocks 200.

The priorities are designed to become higher in order of the search blocks 200-1, 200-2, 200-3, 200-4, . . . , 200-15.

Accordingly, when entry data of input search data key 1 is stored in an unoccupied search block 200-3 for addition purposes, a high priority is assigned. However, if the entry data of input search data key 1, which is to be added, has a low priority, entry data stored in the search blocks 200 needs to be moved as indicated in FIG. 14 in order to maintain the priorities of the individual search blocks 200.

Moving the entry data as described above may lengthen the time required for a data update.

Figure 15:
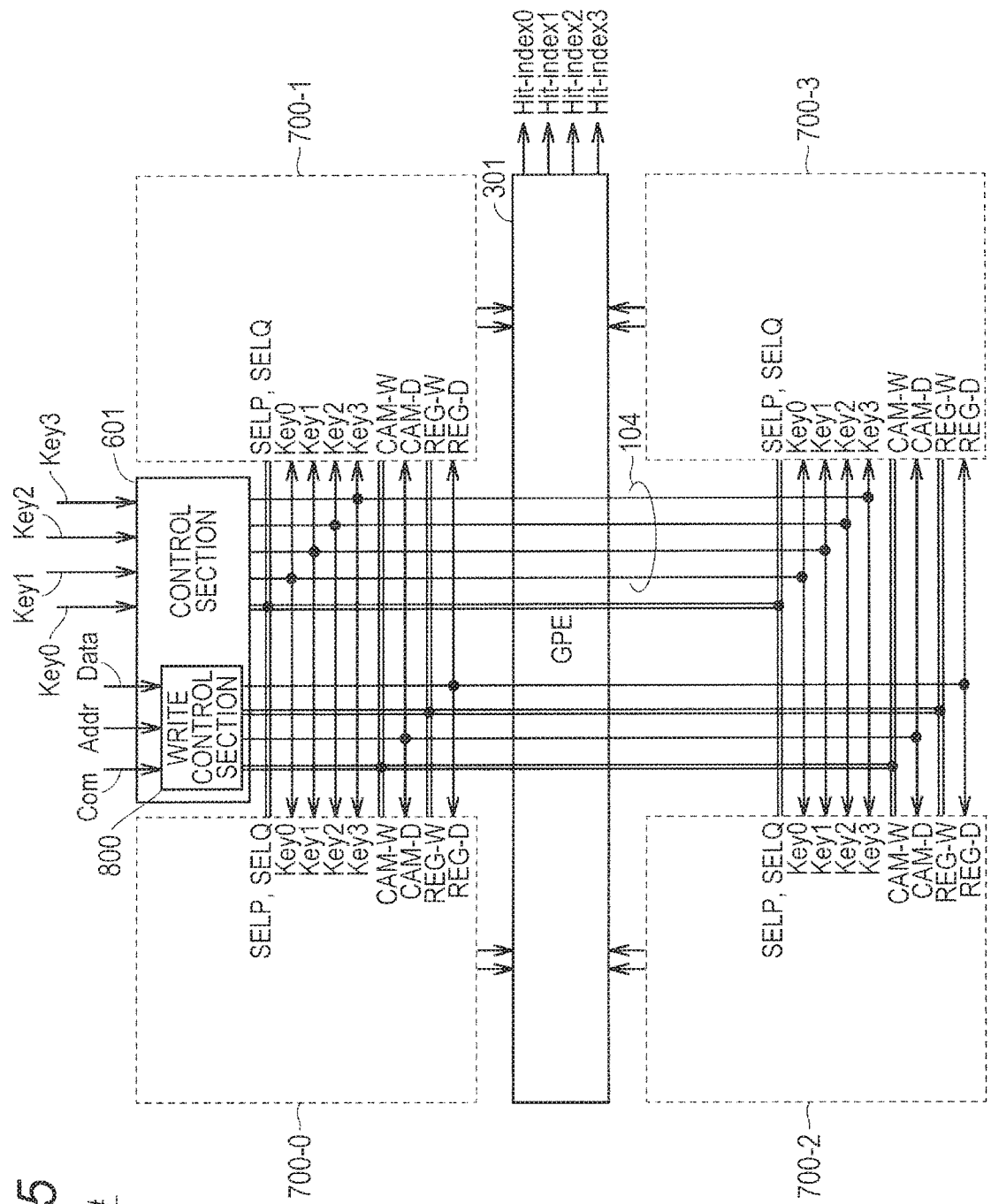
FIG. 15 is a diagram illustrating a configuration of a search memory 8# according to a second embodiment of the present disclosure.

FIG. 15 is a diagram illustrating a configuration of a search memory 8# according to a second embodiment of the present disclosure.

Referring to FIG. 15, the search memory #8 includes multiple search units 700-0 to 700-3 (hereinafter generically referred to also as the search units 700), a control section 601, and a global priority encoder (GPE) 301.

The control section 601 parallelly receives the inputs of multiple input search data keys 0 to 3 (hereinafter generically referred to also as the input search data keys).

The control section 601 respectively outputs input search data keys 0 to 3 to the search units 700.

The control section 601 outputs the select signals SELP and SELQ to each of the search units 700.

The control section 601 includes a write control section 800.

Figure 16:
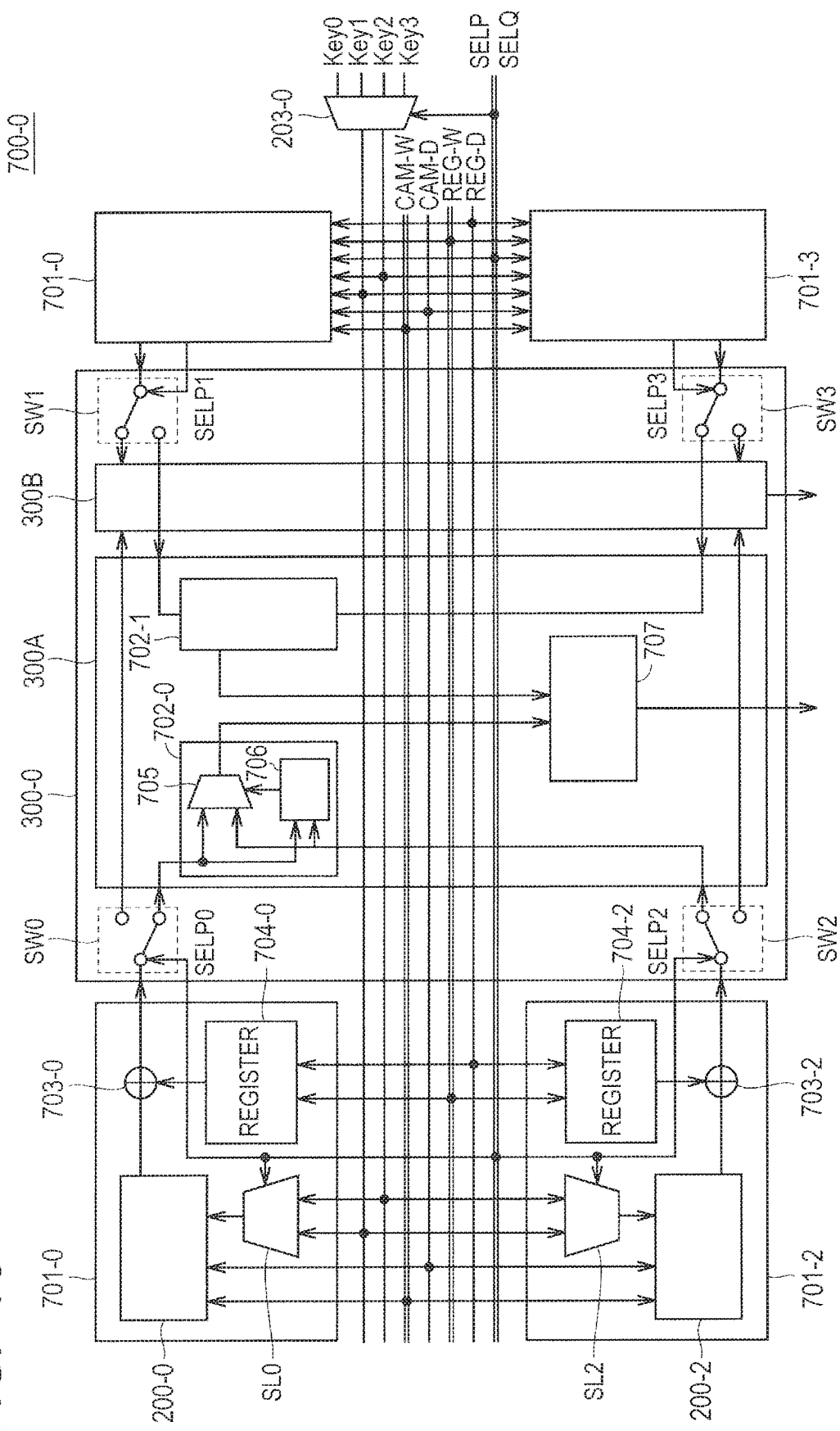
FIG. 16 is a diagram illustrating a configuration of a search unit according to the second embodiment.

FIG. 16 is a diagram illustrating a configuration of the search unit 700-0 according to the second embodiment.

Referring to FIG. 16, the search units 700 each include multiple search blocks 200.

In the present example, the search unit 700-0 is described as a representative.

The write control section 800 exercises control to write data into the search blocks 200 and registers 704.

The search unit 700-0 includes four sub-search units 701-0 to 701-3 (generically referred to also as the sub-search units 701) and a medium priority encoder 300-0. As the sub-search units 701 have basically the same configuration, the configuration of the sub-search units 701-0, 701-2 will be mainly described.

The sub-search unit 701-0 includes a search block 200-0, a selector SL0, a register 704-0 (generically referred to also as the register 704), and a synthesis circuit 703-0 (generically referred to also as the synthesis circuit 703).

The sub-search unit 701-2 includes a search block 200-2, a selector SL2, a register 704-2, and a synthesis circuit 703-2.

The sub-search units 701 differ from the search units 102 described in conjunction with the first embodiment in that the register 704 and the synthesis circuit 703 are added. The other elements are identical with those described in conjunction with the first embodiment and will not be redundantly described in detail.

The register 704 stores the block address of an associated search block 200.

The synthesis circuit 703 regards the block address stored in the register 704 as high-order bits, regards the address information (hit-index) outputted from the search block 200-0 as low-order bits, and outputs the combination of the high- and low-order bits.

A configuration of the medium priority encoder 300-0 will now be described.

The medium priority encoder 300-0 includes switches SW0-SW3 and priority encoders 300A, 300B.

The switches SW0-SW3 are respectively disposed in association with the sub-search units 701-0 to 701-3.

In accordance with the select signals SELP0-SELP3, the switches SW0-SW3 output the address information (hit-index) outputted from each of the sub-search units 701-0 to 701-3 to either one of the priority encoders 300A, 300B.

The priority encoder 300A includes determination circuits 702-0, 702-1, 707.

The determination circuit 702-0 includes a selector 705 and a priority decision circuit 706.

The priority decision circuit 706 decides on a higher-priority in accordance with the address information (hit-index) inputted from the sub-search units 701-0, 701-2.

In accordance with the decision made by the priority decision circuit 706, the selector 705 outputs high-priority address information (hit-index).

The determination circuit 702-1 has the same configuration as the determination circuit 702-0.

More specifically, the determination circuit 702-1 decides on a higher-priority in accordance with the address information (hit-index) inputted from the sub-search units 701-1, 701-3, and outputs high-priority address information (hit-index).

The determination circuit 707 also has the same configuration as the determination circuit 702-0, compares the address information (hit-index) inputted from the determination circuit 702-0 with the address information (hit-index) inputted from the determination circuit 702-1, and outputs high-priority address information (hit-index).

The priority encoder 300B has the same configuration as the priority encoder 300A.

In the second embodiment, a changeable logical block address is stored in the register 704.

Figure 17:
FIG. 17 is a diagram illustrating the relationship between physical block addresses and logical block addresses according to the second embodiment.

FIG. 17 is a diagram illustrating the relationship between physical block addresses and logical block addresses according to the second embodiment.

Referring to FIG. 17, entry data associated with input search data key 0 is allocated to four search blocks 200. Further, entry data associated with input search data key 1 is allocated to four search blocks 200. Furthermore, entry data associated with input search data key 2 is allocated to four search blocks 200. Moreover, entry data associated with input search data key 3 is allocated to four search blocks 200.

At the time of assigning block addresses to the individual search blocks 200, the second embodiment assigns logical block addresses.

The present example indicates a case where logical block addresses "0000", "0001", "0010", and "0011" are assigned to four search blocks 200 to which entry data associated with input search data key 0 is to be allocated.

The present example also indicates a case where logical block addresses "0100", "0101", "0110", and "0111" are assigned to four search blocks 200 to which entry data associated with input search data key 1 is to be allocated.

The present example further indicates a case where logical block addresses "1000", "1001", "1010", and "1011" are assigned to four search blocks 200 to which entry data associated with input search data key 2 is to be allocated.

The present example additionally indicates a case where logical block addresses "1100", "1101", "1110", and "1111" are assigned to four search blocks 200 to which entry data associated with input search data key 3 is to be allocated.

In the above instance, indicated is a case where the logical block addresses coincide with the physical block addresses.

Figure 18:
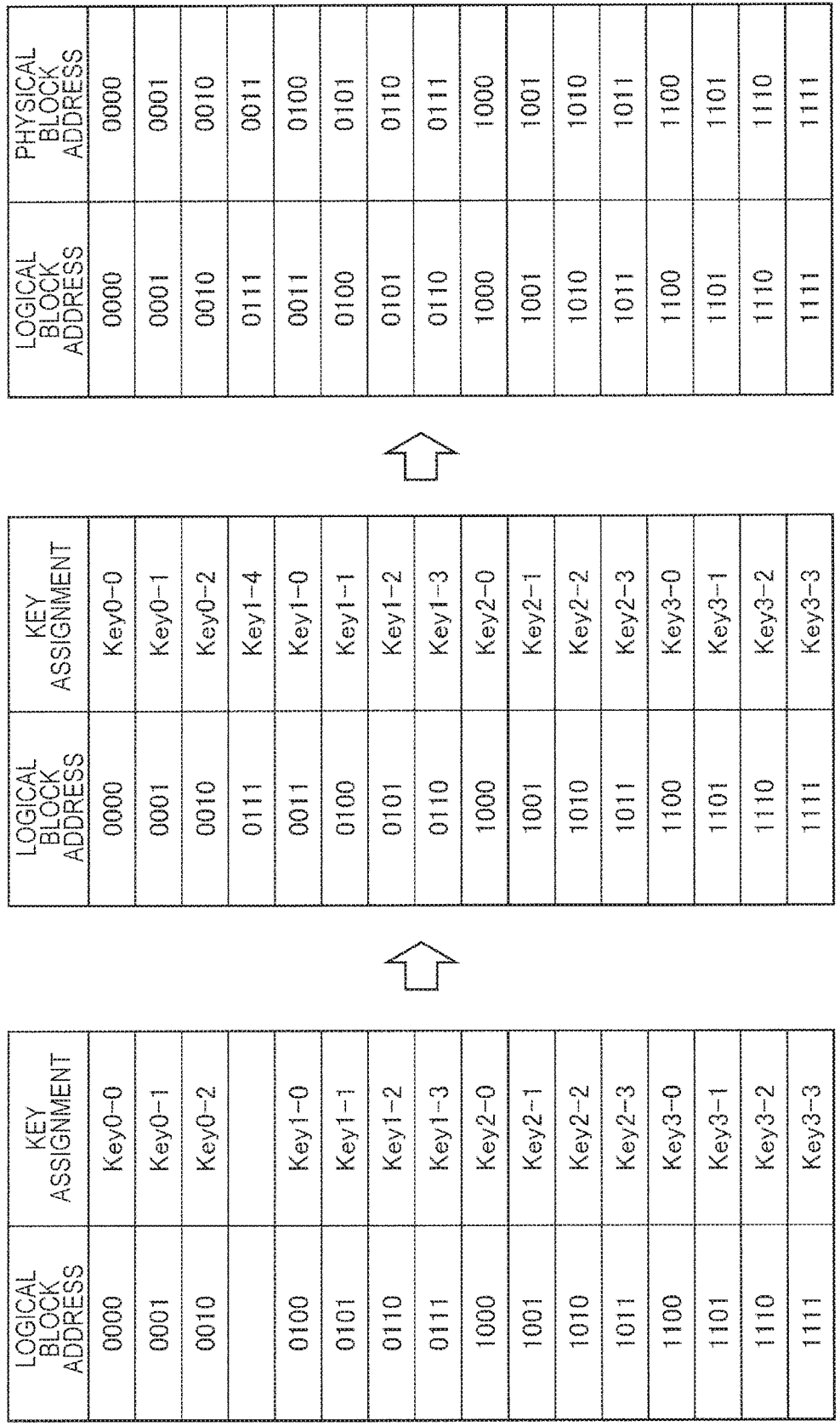
FIG. 18 is another diagram illustrating the relationship between the physical block addresses and logical block addresses according to the second embodiment.

FIG. 18 is another diagram illustrating the relationship between the physical block addresses and logical block addresses according to the second embodiment.

FIG. 18 depicts a case where data in the search block 200-3 for storing entry data associated with input search data key 0 is deleted.

More specifically, depicted in FIG. 18 is a case where entry data in the search block 200-3 associated with logical block address "0011" (physical block address "0011") is deleted.

Further depicted is a case where entry data associated with input search data key 1 is newly allocated.

In the present example, changes are applied to the values of multiple registers 704 respectively associated with multiple search blocks 200 for storing entry data associated with input search data key 1.

More specifically, high-priority logical block addresses are assigned to registers 704 associated with high-priority search blocks 200.

As an example, it is assumed that entry data in a search block 200 at physical block address "0100" has the highest priority, and that entry data in a search block 200 at physical block address "0101" has the second highest priority. It is further assumed that entry data in a search block 200 at physical block address "0110" has the third highest priority, and that entry data in a search block 200 at physical block address "0111" has the fourth highest priority.

Moreover, it is assumed that new entry data associated with input search data key 1 has the lowest priority.

In the present example, a high-priority logical block address is assigned to the register 704 for a search block 200 having the highest priority.

Logical block address "0011" is stored in the register 704 for a search block 200 associated with physical block address "0100".

Logical block address "0100" is stored in the register 704 for a search block 200 associated with physical block address "0101".

Logical block address "0101" is stored in the register 704 for a search block 200 associated with physical block address "0110".

Logical block address "0110" is stored in the register 704 for a search block 200 associated with physical block address "0111".

Eventually, logical block address "0111" is stored in the register 704 for a search block 200 associated with physical block address "0011".

As described above, information stored in the register 704 is subjected to synthesis in the synthesis circuit 703 as high-order bits of the address information to be outputted.

Consequently, as regards the priority of address information (hit-index), entry data in a search block 200 at physical block address "0100" has the highest priority, and entry data in a search block 200 at physical block address "0101" has the second highest priority. Further, entry data in a search block 200 at physical block address "0110" has the third highest priority, and entry data in a search block 200 at physical block address "0111" has the fourth highest priority. Moreover, new entry data associated with input search data key 1 has the lowest priority.

Figure 19:
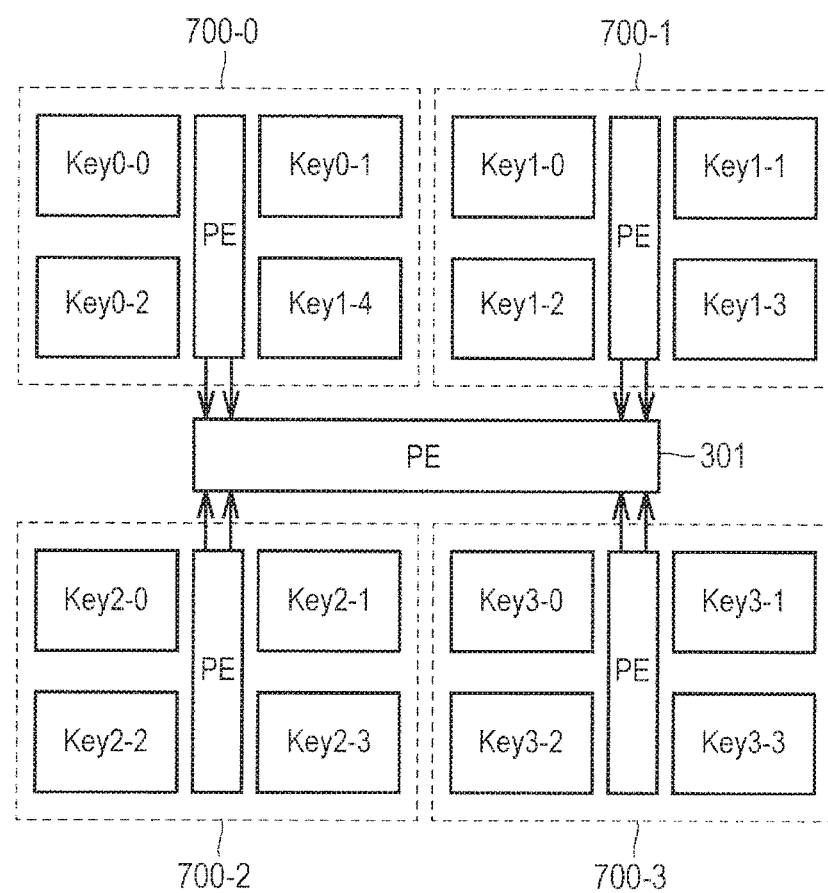
FIG. 19 is a diagram illustrating the update of data in the search memory according to the second embodiment.

FIG. 19 is a diagram illustrating the update of data in the search memory according to the second embodiment.

FIG. 19 depicts a case where data in the search block 200-3 for storing entry data associated with input search data key 0 is deleted due to an update, and entry data associated with input search data key 1 is newly stored in the search block 200-3.

Further, as described above, the values of the registers 704 associated with the search blocks 200-3, 200-4, 200-5, 200-6, 200-7 are updated.

In accordance with the above update of the logical block addresses, the priorities of entry data to be sequentially stored in order of the search blocks 200-4, 200-5, 200-6, 200-7, 200-3 are set.

Consequently, there is no need to actually move the entry data stored in the search blocks 200-4, 200-5, 200-6, 200-7. Changing only the logical block addresses stored in the registers 704 will suffice. That is, a data update process can be executed within a short period of time.

Figure 20:
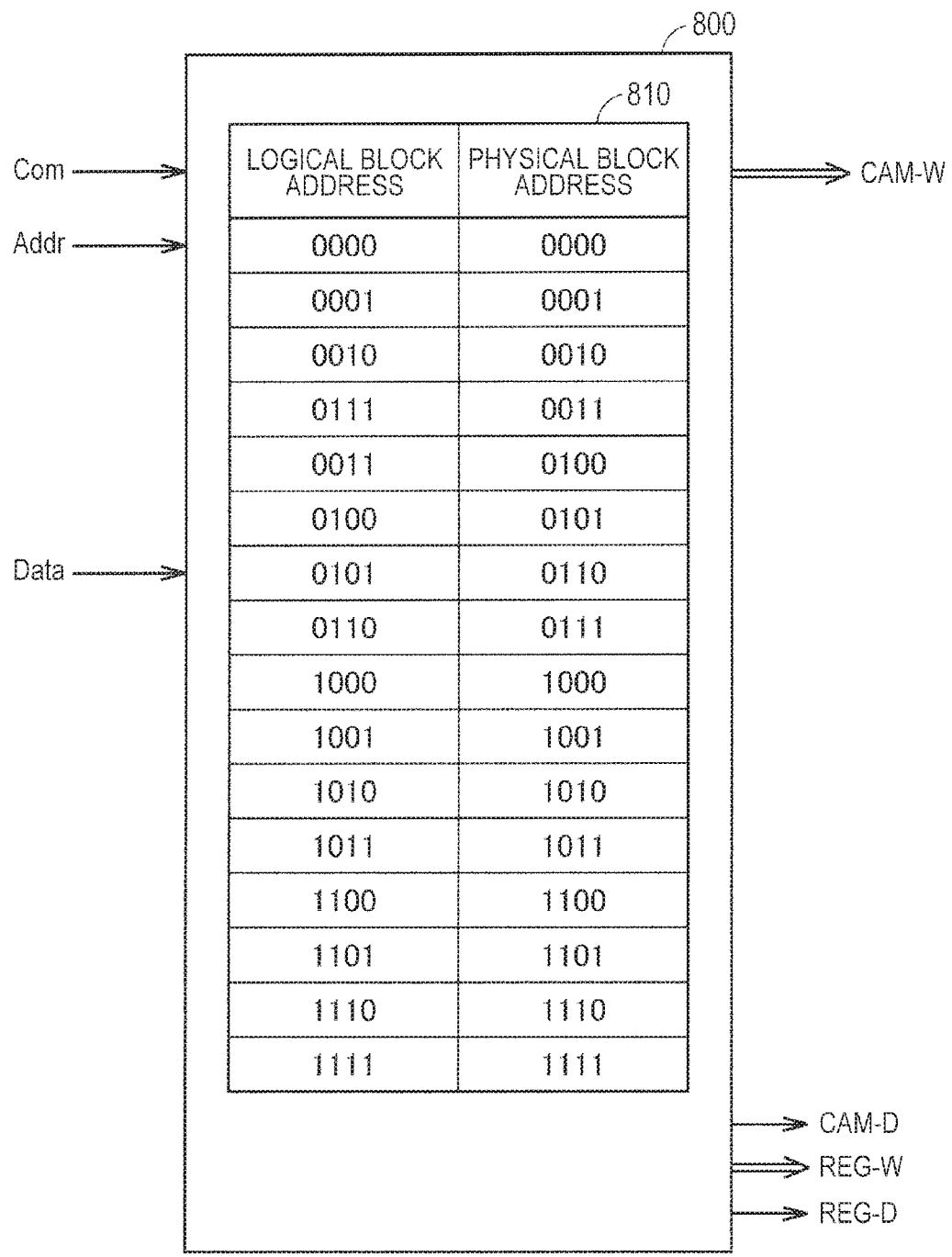
FIG. 20 is a diagram illustrating a write control section included in a control section according to the second embodiment.

FIG. 20 is a diagram illustrating the write control section 800 included in the control section 601 according to the second embodiment.

Referring to FIG. 20, the write control section 800 receives the inputs of a command Com, an address Addr, and data Data from the outside, and outputs a write command CAM-W and write data CAM-D for the search blocks 200. Further, the write control section 800 outputs a write command REG-W and write data REG-D for the registers 704.

Moreover, the write control section 800 has an address conversion table that converts logical block addresses to physical block addresses.

Upon receipt of the command Com, address Addr, and data Data from the outside, the write control section 800 executes an address conversion process by using the address conversion table.

By using the address conversion table, the write control section 800 converts, for example, a high-order bit logical block address of externally inputted address information to a physical block address and gains access to a target search block 200.

The write control section 800 executes an entry data write process on a search block 200 designated by the address Addr in accordance with the write command CAM-W, or executes a logical block address write process on the register 704 for the designated search block 200 in accordance with the write command REG-W.

Modification

In the first and second embodiments, a host system is able to execute a process of determining the allocation of the search blocks 200 in accordance with the above-described specific allocation rule.

Specifically, the above process may be executed by the CPU 2 described with reference to FIG. 1. The CPU 2 collects information concerning the groups of entry data from a neighboring communication circuit through the transfer control circuit 4, and determines, based on the collected information, the allocation of the search blocks in accordance with the above-described specific allocation rule.

Meanwhile, the above process may be executed within the search memory.

Figure 21:
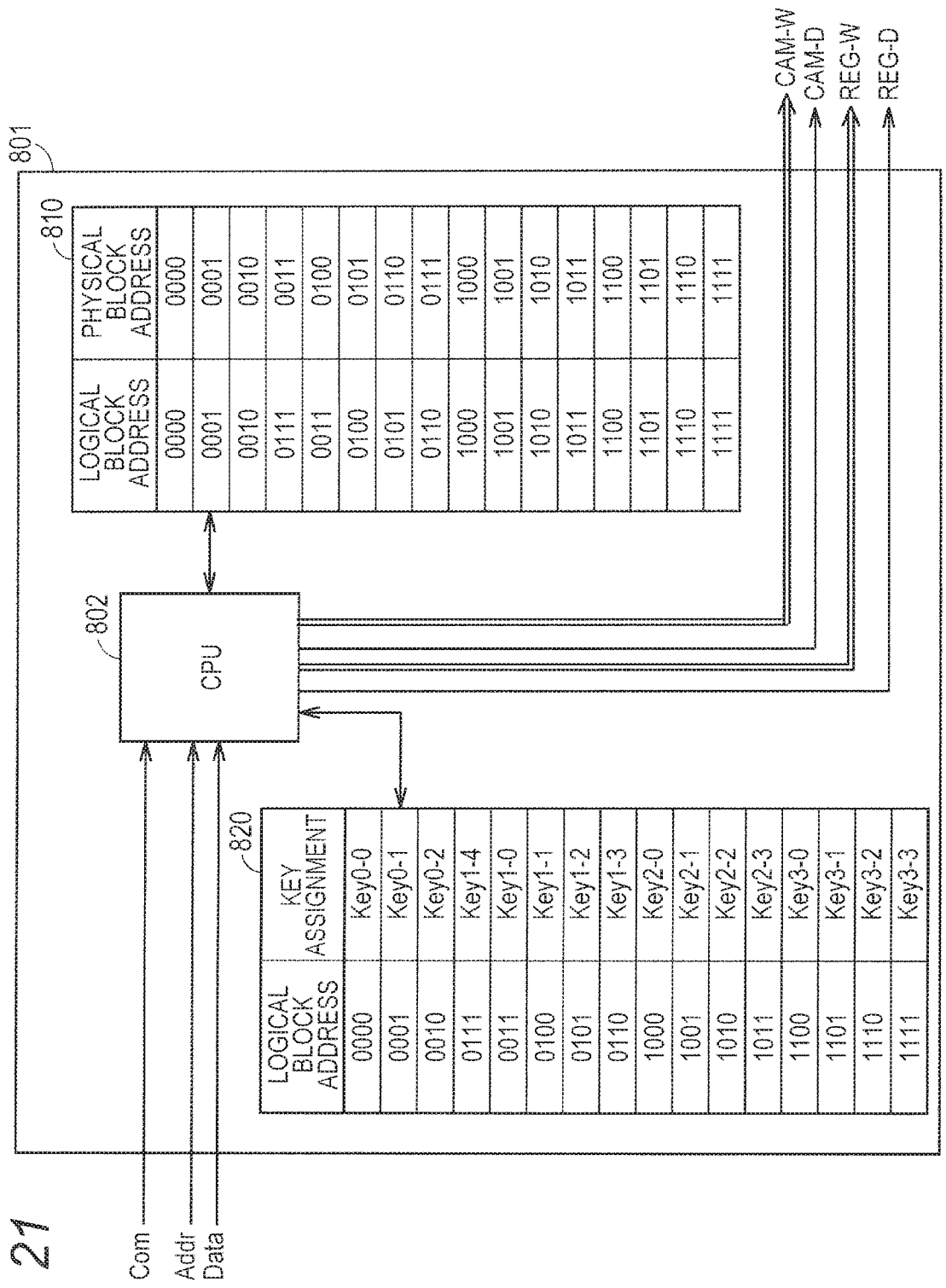
FIG. 21 is a diagram illustrating a configuration of the write control section according to a modification of the second embodiment.

FIG. 21 is a diagram illustrating a configuration of a write control section 801 according to a modification of the second embodiment.

Referring to FIG. 21, the write control section 801 includes a CPU 802.

Based on the respective number of search blocks 200 for storing entry data associated with inputted input search data keys 0 to 3, the CPU 802 executes a process of determining the allocation of the search blocks 200 in accordance with the above-described specific allocation rule.

The CPU 802 allocates, based on the above determination process, the individual search blocks 200 for storing entry data associated with input search data keys 0 to 3, and sets logical block addresses. The CPU 802 then creates an address setting table 820 for defining the association between the logical block addresses and the search blocks 200 that store entry data associated with input search data keys 0 to 3.

Based on the address setting table 820, the CPU 802 creates an address conversion table 810 that defines the association between the set logical block addresses and physical block addresses.

The CPU 802 stores the logical block addresses, which is set by the address setting table 820, in the registers for the search blocks 200 that store entry data associated with input search data keys 0 to 3.

More specifically, the CPU 802 in the write control section 801 receives the inputs of the command Com, address Addr, and data Data, and outputs a write command CAM-W and write data CAM-D for the search blocks 200. Further, the CPU 802 outputs a write command REG-W and write data REG-D for the registers 704.

Further, by using the address conversion table 810, the CPU 802 in the write control section 801 converts, for example, a high-order bit logical block address of externally inputted address information to a physical block address and gains access to a target search block 200.

The CPU 802 in the write control section 801 executes an entry data write process on a search block 200 designated by the address Addr in accordance with the write command CAM-W, or executes a logical block address write process on the register 704 for the designated search block 200 in accordance with the write command REG-W.

According to the above-described process, the priority of a search block 200 can be adjusted by storing entry data in the search block 200 and changing a logical block address stored in the register 704 disposed for the search block 200 to a desired value.

While the present disclosure has been described in detail in terms of particular embodiments, the present disclosure is not limited to the foregoing embodiments. It is to be understood by those skilled in the art that various modifications can be made without departing from the spirit and scope of the present disclosure.

What is claimed is:

1. A search memory that performs a search to determine whether inputted search data matches entry data stored in a memory cell array, and outputs address information associated with matching entry data, the search memory comprising:
   an input control section that receives the inputs of N (N: two or more) search data that are parallelly inputted;
   N search units; and
   N first selectors that are respectively disposed in association with the N search units in order to select two search data from the N search data,
   wherein the search units each include:
   a plurality of search blocks; and
   M second selectors that are respectively disposed in association with the search blocks in order to select one of two search data selected by the first selectors disposed for the associated search units, and
   wherein, for at least one of the N search units, allocation is performed so that two types out of N types of entry data respectively associated with the N search data are respectively stored in the search blocks.

2. The search memory according to claim 1, wherein the search units each include two address information output circuits that are disposed in association with the search blocks in order to output high-priority address information included in address information associated with matching entry data outputted from each of the search blocks.

3. The search memory according to claim 2, further comprising:
   N address information decision circuits that are disposed in association with the N search units in order to respectively output N sets of high-priority address information included in address information outputted from each of the search units.

4. The search memory according to claim 1, further comprising:
   a control section that, when some of the N types of entry data are to be stored in search blocks the number of which is greater than the number of search blocks included in a search unit, allocates, in accordance with a predetermined rule, the N types of entry data to each of the search blocks in the N search units for storage purposes.

5. The search memory according to claim 1,
   wherein the address information includes a block address and a local address, the block address designating at least one of the search blocks, the local address being associated with entry data in a designated search block, and
   wherein the search units each include:
   a plurality of block registers that are disposed in association with the search blocks in order to store the block address of an allocated search block; and
   a plurality of address conversion sections that are respectively disposed in association with the search blocks in order to perform conversion to a logical address associated with matching entry data in a search block designated based on a block address stored in an associated block register and on an associated local address.

6. The search memory according to claim 1,
   wherein the address conversion sections each perform conversion to a logical address that is obtained by combining the associated block address with the associated local address, the associated block address being used as high-order bits, the associated local address being used as low-order bits.

7. The search memory according to claim 6, further comprising:
   an address conversion table that changes physical block addresses to be stored in the block registers included in each of the search units to logical block addresses.

* * * * *